(12) United States Patent
Abesingha et al.

(10) Patent No.: US 9,912,327 B2
(45) Date of Patent: Mar. 6, 2018

(54) DEAD TIME CONTROL CIRCUIT FOR A LEVEL SHIFTER

(71) Applicant: Peregrine Semiconductor Corporation, San Diego, CA (US)

(72) Inventors: Buddhika Abesingha, Escondido, CA (US); Merlin Green, San Diego, CA (US)

(73) Assignee: Peregrine Semiconductor Corporation, San Diego, CA (US)

( * ) Notice: Subject to any disclaimer, the term of this patent is extended or adjusted under 35 U.S.C. 154(b) by 85 days.

(21) Appl. No.: 14/992,989

(22) Filed: Jan. 11, 2016

(65) Prior Publication Data

US 2016/0277012 A1   Sep. 22, 2016

Related U.S. Application Data

(63) Continuation-in-part of application No. 14/661,848, filed on Mar. 18, 2015, now Pat. No. 9,484,897.

(51) Int. Cl.
*H03K 5/14* (2014.01)
*H02M 1/38* (2007.01)
(Continued)

(52) U.S. Cl.
CPC ............... *H03K 5/14* (2013.01); *H02M 1/38* (2013.01); *H02M 7/538* (2013.01);
(Continued)

(58) Field of Classification Search
CPC .. H03K 5/1534; H03K 3/356104; H03K 5/14; H02M 3/156–3/158; H02M 3/1584;
(Continued)

(56) References Cited

U.S. PATENT DOCUMENTS

| 5,416,043 A | 5/1995 | Burgener et al. |
|---|---|---|
| 5,600,169 A | 2/1997 | Burgener et al. |

(Continued)

FOREIGN PATENT DOCUMENTS

| EP | 2731269 | 5/2014 |
|---|---|---|
| EP | 2787642 | 10/2014 |

(Continued)

OTHER PUBLICATIONS

Mehari, Yemane, Notice of Allowance received from the USPTO dated Jul. 27, 2016 for U.S. Appl. No. 14/661,848, 20 pgs.

(Continued)

*Primary Examiner* — Yemane Mehari
(74) *Attorney, Agent, or Firm* — Jaquez Land Greenhaus LLP; Martin J. Jaquez, Esq.; Alessandro Steinfl, Esq.

(57) ABSTRACT

Systems, methods, and apparatus for use in biasing and driving high voltage semiconductor devices using only low voltage transistors are described. The apparatus and method are adapted to control multiple high voltage semiconductor devices to enable high voltage power control, such as power amplifiers, power management and conversion and other applications wherein a first voltage is large compared to the maximum voltage handling of the low voltage control transistors. Timing of control signals can be adjusted via internal and/or external components so as to minimize shoot trough currents in the high voltage devices. A DC/DC power conversion implementation from high input voltage to low output voltage using a novel level shifter which uses only low voltage transistors is also provided. Also presented is a level shifter in which floating nodes and high voltage capacitive coupling and control enable the high voltage control with low voltage transistors.

37 Claims, 28 Drawing Sheets

(51) Int. Cl.
| | |
|---|---|
| *H02M 7/538* | (2007.01) |
| *H03K 17/689* | (2006.01) |
| *H03K 19/0185* | (2006.01) |
| *H03K 5/1534* | (2006.01) |
| *H03K 5/00* | (2006.01) |

(52) U.S. Cl.
CPC ......... *H03K 5/1534* (2013.01); *H03K 17/689* (2013.01); *H03K 19/018514* (2013.01); *H03K 2005/00019* (2013.01)

(58) Field of Classification Search
CPC ........... H02M 3/1588; H02M 3/33561; H02M 2001/007; H02M 2001/009; H02M 2001/0032; H02M 2001/0045; G05F 1/56; G05F 1/565; G05F 1/575
USPC ................ 323/265, 271, 284, 285, 288, 303
See application file for complete search history.

(56) References Cited

U.S. PATENT DOCUMENTS

| | | | |
|---|---|---|---|
| 7,199,617 B1* | 4/2007 | Schrom .......... | H03K 19/018528 326/68 |
| 8,049,532 B1* | 11/2011 | Maangat ........ | H03K 19/017509 326/68 |
| 8,169,108 B2 | 5/2012 | Dupuis et al. | |
| 8,493,101 B2 | 7/2013 | Vogler et al. | |
| 8,593,128 B2* | 11/2013 | Burns .................. | H03K 17/102 323/224 |
| 9,197,194 B2 | 11/2015 | Reedy et al. | |
| 9,484,897 B2 | 11/2016 | Green et al. | |
| 2005/0156631 A1* | 7/2005 | Huang ................. | H03K 17/102 326/81 |
| 2006/0087470 A1 | 4/2006 | Abdoulin | |
| 2007/0159150 A1* | 7/2007 | Hosokawa .......... | H02M 3/1588 323/285 |
| 2008/0224755 A1 | 9/2008 | Jo | |
| 2009/0206817 A1 | 8/2009 | Ng et al. | |
| 2013/0314065 A1* | 11/2013 | Jian ........................... | G05F 1/46 323/284 |
| 2014/0169038 A1 | 6/2014 | Kamath et al. | |
| 2014/0333365 A1 | 11/2014 | Takahashi | |
| 2015/0229307 A1* | 8/2015 | Badrudduza ....... | H03K 3/35613 327/333 |
| 2016/0164413 A1* | 6/2016 | Akiyama ......... | H03K 17/04206 323/271 |
| 2016/0277008 A1 | 9/2016 | Green et al. | |
| 2017/0117883 A1 | 4/2017 | Green et al. | |

FOREIGN PATENT DOCUMENTS

| | | |
|---|---|---|
| WO | 2009108391 | 9/2009 |
| WO | 2017123269 | 7/2017 |

OTHER PUBLICATIONS

Duperron, Nathalie, Notification of Transmittal of the International Search Report and Written Opinion of the International Searching Authority, or the Declaration received from the EPO dated Oct. 19, 2016 for appln. No. PCT/US2016/024023.
Yu, et al., "A 60-V, > 225 C Half-Bridge Driver for Piezoelectric Acoustic Transducer, on SOI CMOS", IEEE Transactions on Circuits and Systems . . . II: Express Briefs, Vo. 59, No. 11, Nov. 2012, pp. 771-775.
Herzer, R., "Integrated Gate Driver Circuit Solution", CIPS 2010, Mar. 16-18, 2010, Nuremberg, Germany, Paper 1.2, 10 pgs.
Huque, et al., "Silicon-on-Insulator-Based High-Voltage, High-Temperature Integrated Circuit Gate Driver for Silicon Carbide-Based Power Field Effects Transistors", IET Power Electronics, revised on Feb. 3, 2009, vol. 3, Issue 6, pp. 1001-1009.
Martinez, Martinez, Written Opinion of the International Preliminary Examining Authority received from the EPO dated Feb. 15, 2017 for appln No. PCT/US2016/015691, 12 pgs.
Peregrine Semiconductor Corporation, Response filed in the EPO dated Apr. 14, 2017 for appln. No. PCT/US2016/015691, 26 pgs.
Ghilini, Marie, International Preliminary Report on Patentability received from the EPO dated Jun. 16, 2017 for appln. No. PCT/US2016/015691, 23 pgs.
Le, Dung Anh, Office Action received from the USPTO dated Jun. 30, 2017 for U.S. Appl. No. 15/385,618, 9 pgs.
Texas Instruments, "ISO721D 3.3/5V High-Speed Digital Isolators", Digi-Key Electronics, 1995-2015, 2 pgs.
Analog Devices, "Quad-Channel, Digital Isolators, Enhanced System-Level ESD Reliability", Data Sheet ADuM3400/ADuM3401/ADuM3402, Revision C, 2006-2014, 24 pgs.
Fandrich, Cory Lynn, "An On-Chip Transformer-Based Digital Isolator System", University of Tennessee, Knoxville, Trace: Tennessee Research and Creative Exchange, Masters Theses, Dec. 2013, 68 pgs.
Gingerich, et al., "The ISO72x Family of High-Speed Digital Isolators", Texas Instruments, Application Report, SLLA198—Jan. 2006, 12 pgs.
Austin, Catherine, "IXYS Announces the CPC5001, Dual, One-Channel Each Direction Digital Optical Isolator-Operational from 2.7 to 5.5 volts with logic-level inputs and open-drain outputs", Press Release, Sep. 26, 2013, 2 pgs.
Maxim Integrated, "Six-Channel Digital Isolator", MAX14850, 19-6161, Rev. 2, Nov. 2014, 17 pgs.
Avent Memec, "Maxim Integrated Fast Digital Isolator Interfacing 1.8V Devices", 2 pgs.
Silicon Labs, "Si88xx Isolators", 4 pgs.
Silabs, "Isolator vs. Optocoupler Technology".
Silicon Labs, "CMOS Digital Isolators Supersede Optocouplers in Industrial Applications", Rev. 0.2, 18 pgs.
Avago Technologies, "2.5A Output Current SiC/GaN MOSFET and IGBT Gate Drive Optocoupler" ACPL-P349-000E, 3 pgs.
Avago Technologies, "2.5 Amp Gate Drive Optocoupler with Integrated Flyback Controller for Isolated DC-DC Converter, IGBT Desat Detection, Active Miller Clamping, Fault and UVLO Status Feedback", ACPL-203J, Data Sheet, Apr. 28, 2015, 18 pgs.
Avago Technologies, "2.5 Amp Output Current SiC/GaN MOSFET and IGBT Gate Drive Optocoupler in Stretched S06", ACPL-P349 and ACPL-W349, Data Sheet, Jan. 8, 2015, 16 pgs.
Greenwell, et al., "SOI-Based Integrated Circuits for High-Temperature Power Electronics Applications", Department of Electrical Engineering and Computer Science, The University of Tennessee, IEEE, 2011, pp. 836-884.
Huque, et al., "An SOI-based High-Voltage, High-Temperatures Gate-Driver for SiC FET", Department of Electrical Engineering and Computer Science, The University of Tennessee, IEEE 2007, pp. 1491-1495.
Huque, et al., "A High-Temperature, High-Voltage SOI Gate Driver IC with High Output Current and On-Chip Low-Power Temperature Sensor", 2009 International Symposium on Microelectronics, pp. 000220-000227.
Avent Memec, "Maxim Integrated Fast Digital Isolator Interfacing 1.8V Devices", 2015, 2 pgs.
Silicon Labs, "Si88xx Isolators", 2015, 4 pgs.
Silabs, "Isolator vs. Optocoupler Technology", 2015, 24 pgs.
Silicon Labs, "CMOS Digital Isolators Supersede Optocouplers in Industrial Applications", Rev. 0.2, Nov. 2010, 18 pgs.
Avago Technologies, "2.5A Output Current SiC/GaN MOSFET and IGBT Gate Drive Optocoupler" ACPL-P349-000E, Jan. 2015, 3 pgs.
Moghe, et al., "Monolithic 2.5kV RMS, 1.8V-3.3V Dual-Channel 640Mbps Digital Isolator in 0.5um Sos", IEEE 2012, 2 pgs.
Green, et al., "Leverl Shifter", patent application filed in the U.S. Patent Office on Mar. 18, 2015, U.S. Appl. No. 14/661,848, 69 pgs.
Camps, Ester, International Search Report received from the EPO dated Apr. 19, 2016 for appln. No. PCT/US2016/015691, 17 pgs.
Mehari, Yemane, Office Action received from the USPTO dated Jul. 14, 2017 for U.S. Appl. No. 15/286,097 34 pgs.

(56) References Cited

OTHER PUBLICATIONS

Peregrine Semiconductor Corporation, Demand and Amendment filed in the PEO dated Aug. 25, 2017 for appln. No. PCT/US2016/024023, 22 pgs.
Green, et al., Response filed in the USPTO dated Sep. 1, 2017 for U.S. Appl. No. 15/286,097, 4 pgs.
Mehari, Yemane, Notice of Allowance received from the USPTO dated Sep. 19, 2017 for U.S. Appl. No. 15/286,097, 14 pgs.
Jepsen, John, Written Opinion of the International Preliminary Examining Authority received from the EPO dated Dec. 7, 2017 for corresponding PCT Application No. PCT/US2016/024023, 9 pgs.

* cited by examiner

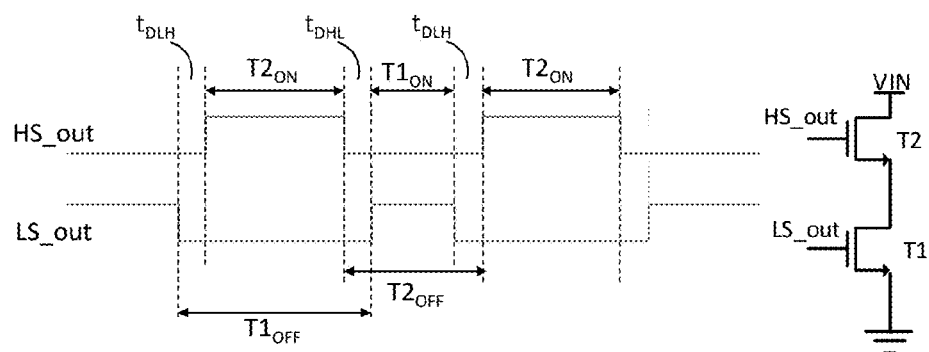
FIG. 12A
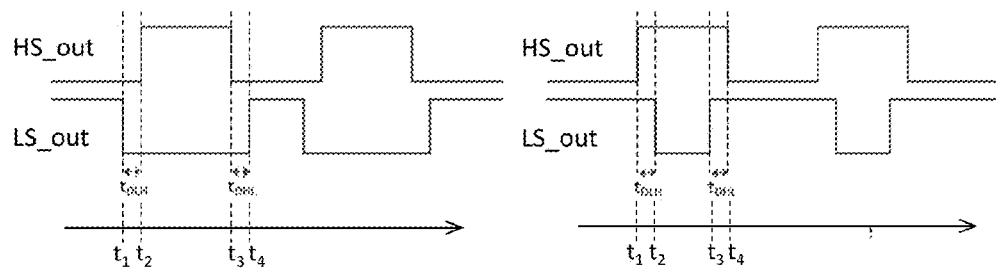
FIG. 12B
FIG. 12C

US 9,912,327 B2

DEAD TIME CONTROL CIRCUIT FOR A LEVEL SHIFTER

CROSS REFERENCE TO RELATED APPLICATIONS

This application is a continuation-in-part of commonly owned and co-pending U.S. patent application Ser. No. 14/661,848 filed Mar. 18, 2015, entitled "Level Shifter", the disclosure of which is incorporated herein by reference in its entirety. The present application may be related to U.S. Pat. No. 5,416,043, issued on May 6, 1995 and entitled "Minimum charge FET fabricated on an ultrathin silicon on sapphire wafer", the disclosure of which is incorporated herein by reference in its entirety. The present application may also be related to U.S. Pat. No. 5,600,169, issued on Feb. 4, 1997 and entitled "Minimum charge FET fabricated on an ultrathin silicon on sapphire wafer", the disclosure of which is incorporated herein by reference in its entirety. The present application may also be related to PCT publication number WO2009/108391 entitled "Method and Apparatus for use in Digitally Tuning a Capacitor in an Integrated Circuit Device", published on Sep. 3, 2009, and to U.S. patent application Ser. No. 13/595,893, entitled "Methods and Apparatuses for Use in Tuning Reactance in a Circuit Device", filed on Aug. 27, 2012, the disclosures of which are incorporated herein by reference in their entirety.

BACKGROUND

1. Field

Various embodiments described herein relate generally to systems, methods, and devices for use in biasing and driving high voltage semiconductor devices using only low breakdown voltage transistors.

2. Description of Related Art

In applications where high voltage semiconductor devices operating in high voltage conditions are controlled, high breakdown voltage transistors are typically used in corresponding control circuitry. For example, in traditional gallium nitride (GaN) power management applications, transistors such as laterally diffused metal oxide semiconductor (LDMOS), bipolar or high voltage metal-oxide-semiconductor field-effect transistors (MOSFETs) can be utilized to control the GaN devices operating in high voltage conditions. Since these control transistors typically have poor figure of merit (FOM), compared to the FOM of the GaN devices, which can thereby, for example, limit the operating frequencies of the GaN devices, the overall circuit (e.g. power management) can be limited in performance by the large, high voltage control transistors which can be difficult to charge and discharge quickly (e.g. their FOM is too high) and therefore the benefit of using the GaN devices can be substantially reduced. In such applications where high voltage devices (e.g. GaN) are controlled, it can be desirable to tightly control timing of the ON state of the high voltage devices, so as to, for example, reduce or eliminate overlap time of the high voltage devices in the ON state.

SUMMARY

According to a first aspect of the present disclosure, a circuital arrangement is presented, the circuital arrangement being configured to control a high side (HS) device and a low side (LS) device arranged in a stacked configuration, the HS device and the LS device capable of withstanding a voltage higher than or equal to a first voltage, the circuital arrangement comprising: a HS control circuit operating between a first switching voltage and a second switching voltage based on the first switching voltage, the first switching voltage being an output voltage at a common output node of the stacked HS device and LS device, the HS control circuit configured to provide a HS output control signal at a voltage higher than the first voltage to the HS device; a LS control circuit configured to provide a LS output control signal to the LS device; and a dead time control circuit configured, to generate timing information for the HS output control signal and the LS output control signal, wherein all transistor devices of the HS control circuit, the LS control circuit and the dead time controller circuit, are each configured to withstand a second voltage substantially smaller than the first voltage.

According to a second aspect of the present disclosure, a method for controlling a high side (HS) device and a low side (LS) device arranged in a stacked configuration is presented, the HS device and the LS device capable of withstanding a voltage higher than or equal to a first voltage, the method comprising: receiving an input timing signal; based on the receiving, generating control timing signals for controlling the HS device and the LS device; generating, via capacitve coupling of the control timing signals, an HS output control signal at a voltage higher than the first voltage; generating, based on the control timing signals, an LS output control signal; controlling the HS device via the HS output control signal; and controlling the LS device via the LS output control signal; wherein the steps of generating are provided by transistor devices configured to withstand a second voltage substantially smaller than the first voltage.

BRIEF DESCRIPTION OF THE DRAWINGS

The accompanying drawings, which are incorporated into and constitute a part of this specification, illustrate one or more embodiments of the present disclosure and, together with the description of example embodiments, serve to explain the principles and implementations of the disclosure.

FIGS. 12A-12C show timing diagrams of the high side and the low side control signals generated by the gate driver of FIG. 10.

DETAILED DESCRIPTION

Figure 1:
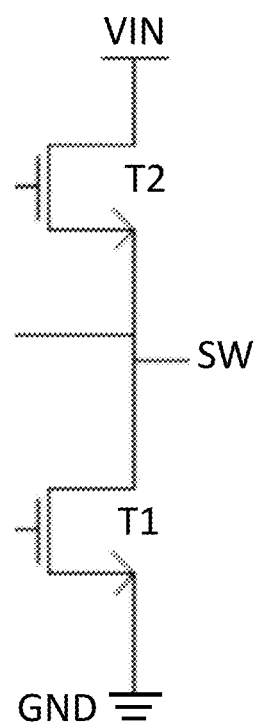
FIG. 1 shows two high voltage stacked transistors, a low side transistor, LS, T1, and a high side, HS, transistor T2.

It can be desirable to use small, low breakdown voltage MOSFET transistors which can have figure of merits (FOMs), as measured, for example, by the product of the ON resistance $R_{on}$ of the transistor and the gate charge $C_g$ of the transistor, similar to or better (lower) than the FOM of high voltage transistors (transistors with higher breakdown voltage) as controlling transistors in applications where high voltage semiconductor devices operating in high voltage conditions are controlled. Such MOSFETs can allow for best use of the GaN characteristics, thereby improving both performance and cost of the implementation. In addition, by implementing a single chip silicon on insulator (SOI) MOSFET solution based on low voltage MOSFETs, additional functionality can be included which address additional areas known to a person of ordinary skill in the art such as, but not limited to, GaN gate voltage overdrive protection, minimum gate drive requirements, dead time control, temperature stability, floating node tracking and startup voltage condition among others.

The present disclosure describes a level shifter circuit capable of driving control voltages or analog signals at relatively low voltages such as about 0 to 3.5/5V, while riding, or "flying," on top of high voltages substantially higher than the low voltages, such as 20-100 V or higher. The various embodiments presented herein describe low voltage control of high voltages performed by the novel level shifter which enables proper control of high voltage devices using low (breakdown) voltage transistors of the level shifter, where the low breakdown voltage is substantially smaller than the high voltage.

As used in the present disclosure, a high voltage device or high voltage transistor refers to a semiconductor transistor device which can withstand and block (e.g. in the OFF state) DC voltages (typically applied between the source and drain terminals of the transistor, or any two of drain, source and gate terminals) greater than 5-10 V, and more typically substantially greater than 5-10 V, such as greater than 20-100 V. Some exemplary high voltage devices are depletion mode GaN transistors (d-GaN), enhancement mode GaN transistors (e-GaN), stacked MOS transistors, and other high-voltage transistors known to a person skilled in the art, such as Si MOSFETs, hexagonal shape FETs (HEXFETs), LDMOS, indium phosphide (InP), etc. which can also be enhancement or depletion modes (e.g. e-type or d-type) and N or P polarity.

In the present disclosure e-GaN FET transistors are used as exemplary high voltage devices in order to describe the various embodiments of the present application, and therefore such exemplary usage should not be construed as limiting the scope of the invention as disclosed herewith. Unless explicitly mentioned as d-GaN, the terms GaN and e-GaN are considered synonymous herein.

A person skilled in the art can recognize that depletion mode d-GaN devices or other types of high voltage transistors such as Si MOSFETs, HEXFETs, LDMOS, InP (and all these examples can be of the e-type or d-type; and N or P polarity) or virtually any device capable of switching ON or OFF with high voltages applied can be controlled in accordance with the teachings of the present disclosure.

E-GaN devices have typical threshold, or turn-on, voltages of approximately +0.7 to +3 V of gate-to-source voltage. Such devices are typically capable of withstanding 5 V to 200 V of drain-to-source, $V_{DS}$, voltage, thereby enabling high voltage applications, such as, for example, DC/DC power conversion from a high input voltage to a low output voltage. GaN transistors are used in the present disclosure as an exemplary approach to high voltage power management due to the known advantageous characteristics of GaN transistors, such as, for example, a low FOM.

As used in the present disclosure, a low voltage device or low voltage transistor refers to a semiconductor transistor device with a low breakdown voltage which can withstand and block (e.g. in the OFF state) DC voltages (e.g. typically applied between the source and drain terminals of the transistor, or any two of drain, source and gate terminals) less than 10 V and more typically substantially less than 10V, such as less than 3.3-5 V. Some exemplary low voltage devices are complementary metal-oxide-semiconductor (CMOS) transistors.

As used in the present disclosure, the figure of merit (FOM) of a switching transistor (e.g. a transistor which can have a conducting ON state and a non-conducting OFF state), also simply noted as FOM, refers to the product of the ON resistance $R_{on}$ of the transistor and the gate charge $C_g$ of the transistor. A lower FOM can be indicative of a higher switching performance of a transistor. Having a low FOM, especially at high withstand voltages, is a distinctive characteristic of GaN transistors, which are capable of handling up to 100 V with a FOM approximately ten times lower than the FOM of a high voltage MOSFET.

Throughout this description, embodiments and variations of the level shifter are described for the purpose of illustrating uses and implementations of the inventive concept. The illustrative description should be understood as presenting examples of the inventive concept, rather than as limiting the scope of the concept as disclosed herein.

The various embodiments of the present disclosure can be used in applications where control of high voltage devices is desirable using low voltage transistors. Although the exemplary case of DC/DC converters is used to describe the various embodiments of the level shifter according to the present disclosure, such exemplary case should not be construed as limiting the scope of the invention as disclosed herewith. The person skilled in the art is able to use the teachings according to the present disclosure and apply such teachings to specific applications where low voltage control of high voltages is desired.

FIG. 1 shows two stacked GaN transistors, T1 and T2, which can be used as a basis for high voltage stacked GaN transistors. As used in the present disclosure, transistors T1 and T2 can be referred to as, respectively, the low side (LS) transistor and the high side (HS) transistor, and any controlling element associated in controlling the LS transistor and the HS transistor can likewise be referred to as, respectively, the low side (LS) control and the high side (HS) control. In the present disclosure DC/DC conversion serves as an exemplary application for control of stacked high voltage transistors whose teachings can be applied to other applications where stacked transistors control voltages larger than the inherent voltage handling capability of conventional control devices (e.g. using low voltage control transistors). A person skilled in the art will recognize that while the exemplary DC/DC converter using the stacked transistor of FIG. 1 relies on two stacked GaN FETs T1 and T2, the inventive control system disclosed herein can be applied to a stack height of one, as well as to larger stack heights of three, four, or any number of stacked transistors, and to any high voltage transistor made in other materials and/or fabrication processes.

Figure 2:
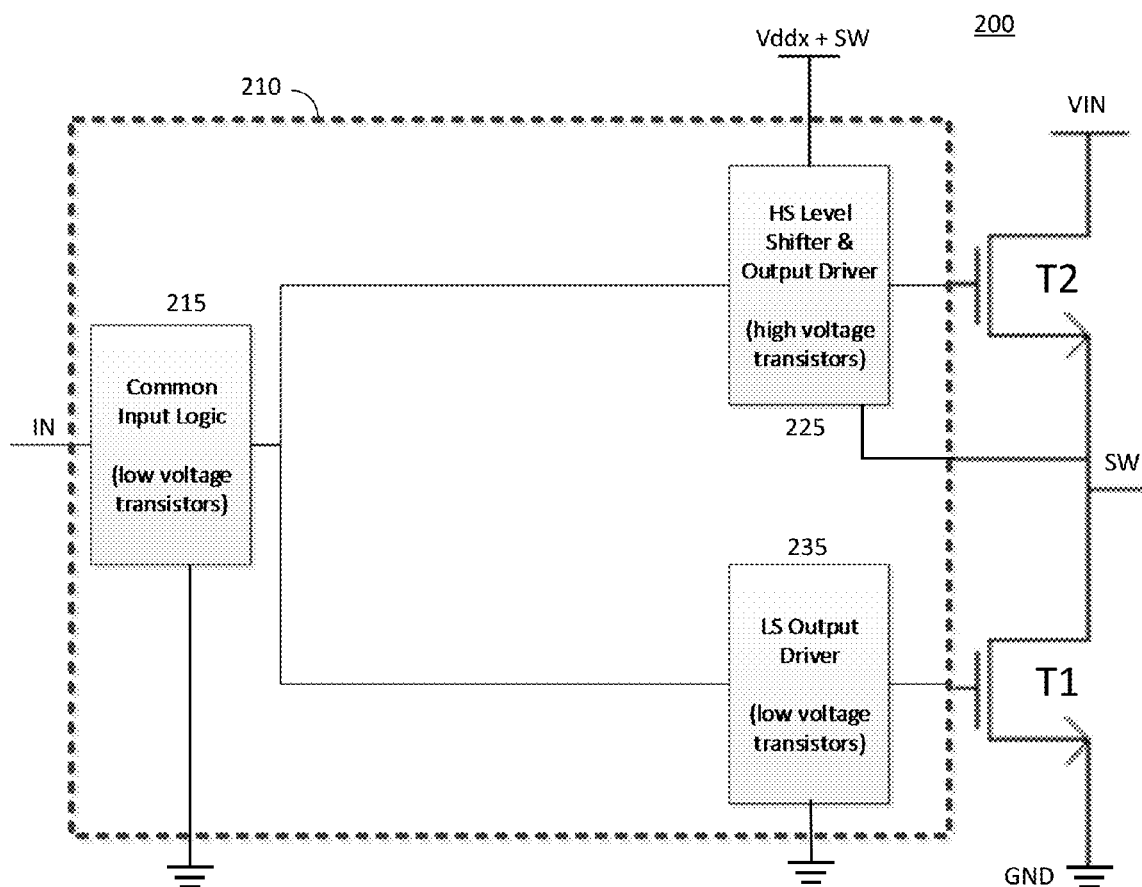
FIG. 2 shows a prior art embodiment of a gate driver circuit used for controlling the low side and the high side of the high voltage stacked transistors of FIG. 1.

FIG. 2 shows a typical prior art embodiment of a gate driver circuit (210) used for controlling the stacked GaN transistors T1, T2 of FIG. 1. Such prior art circuit depicted in FIG. 2 can be used for implementing, for example, a DC/DC converter. The input voltage, $V_{IN}$, shown in FIGS. 1 and 2, applied to the drain of the top transistor T2 (high side transistor) of the stack can be as high as the voltage handling capability of the chosen GaN transistors T1 and T2 (e.g. 20V-100V or higher). As known by a person skilled in the art, based on the input voltage $V_{IN}$, a lower voltage can be generated by controlling the length of time of the ON/OFF states of the two transistors. Such low voltage can be obtained, for example, by filtering a voltage at the common output node SW of the two transistors T1 and T2.

As can be seen in the prior art embodiment of FIG. 2, the source of the lower GaN transistor T1 is tied to a reference ground, GND, and the source of the upper GaN transistor T2 is tied to the drain of T1, which together create an output node SW. Throughout the present disclosure, all circuits or devices associated with (e.g. with controlling) the LS transistor T1 are referred to as low side or LS circuits, devices, or controls, and those associated with the HS transistor T2 are referred to as high side or HS circuits, devices, or controls.

The exemplary prior art circuit shown in FIG. 2 converts the high input voltage $V_{IN}$, to a lower voltage obtained via the output node SW. In one exemplary embodiment $V_{IN}$ can be 40V and the lower voltage obtained via node SW (e.g. via filtering of voltage at node SW) can be about 1.5V. In addition to being able to handle high voltage, it is important for the DC/DC converter of FIG. 2 to exhibit high efficiency in making such a conversion and also doing so at a high frequency. The person skilled in the art readily understands the concept of efficiency in a power conversion application, as well as the desired high frequency conversion which enables use of smaller inductive components in a filter (not shown in FIG. 2) associated to the output node SW. GaN devices provide high efficiency due to their low Ron, as discussed above, while simultaneously switching at high speed due to their low Cg.

The gate driver circuit (210) of the prior art embodiment depicted in FIG. 2 controls the switching of the LS transistor and the HS transistor of the high voltage stacked transistors depicted in FIG. 1 between their respective ON and OFF states to provide a desired voltage, based on the input voltage $V_{IN}$, at node SW. The gate driver circuit (210) controls the switching of the LS transistor T1 and the HS transistor T2 by providing the gate voltages needed to turn ON or OFF each of the two transistors T1 and T2, typically in an alternating fashion, where only one of the two transistors can be ON (or OFF) at any one time. Such gate voltages can be obtained via a feedback loop (not shown) between a filtered voltage based on the voltage at node SW and the input terminal IN to the gate driver circuit (210). The person skilled in the art readily knows that a pulse width modulator (PWM) controlled by the filtered voltage (e.g. at node SW) can be used in such feedback loop to provide low voltage control timing pulses to the gate driver circuit (210). Such low voltage timing pulses can be fed to the input block Low Voltage Transistors logic (215) of the driver circuit (210) of FIG. 2, and subsequently fed to the HS Level Shifter (& Output Driver) (225), which includes high (breakdown) voltage transistors, for conversion to a voltage level adequate to control the gates of the HS transistor T2 of the high voltage stacked transistors of FIG. 1.

In a typical implementation and upon a power up sequence, the gate driver circuit (210) of the prior art embodiment depicted in FIG. 2 can initially turn off either the high side transistor (T2) or both of the high side and the low side transistors (T1, T2) to ensure that both T1 and T2 are in a safe OFF state while all other DC/DC converter associated circuitry stabilizes upon the power-up. Subsequently, the gate driver (210) can control a DC voltage conversion (e.g. VIN to SW) by initially turning on the low side (LS) transistor T1 by driving its gate voltage above its threshold voltage while turning OFF the high side (HS) transistor T2. This brings the voltage at node SW to GND since T1 is conducting and therefore its $V_{DS}$ can be very close to zero. Also, since the source of T2 is close to GND, the HS transistor T2 holds off all of the $V_{IN}$ voltage applied to its drain (e.g. its $V_{DS}=V_{IN}$).

Alternatively, when the gate driver (210) of the prior art embodiment depicted in FIG. 2 turns OFF LS transistor T1 and turns ON the HS transistor T2 of FIG. 2, the output node SW is charged high toward the voltage VIN. Since the HS transistor T2 is conducting and the LS transistor T1 is not conducting, during the ON period (e.g. length of time of ON state) of the HS transistor T2, the output node SW will have a nominal voltage equal to $V_{IN}$, other than during a corresponding charging and discharging period at the beginning and end of the ON period. During the ON period of T2, the gate voltage of HS transistor T2 stays positive (e.g. by a voltage equal to Vddx as provided by the Vddx+SW supply to the HS transistor T2 controlling block (225)) with respect to the voltage at the output node SW such as to keep the HS transistor T2 ON and conducting strongly (e.g. Vddx≥$V_{th}$ of T2, where Vth is the threshold voltage of HS transistor T2), thereby keeping the voltage at node SW at $V_{IN}$. Hence the driving nodes in the gate driver controller circuit (210) connected to node SW can withstand voltages with respect to GND up to the voltage $V_{IN}$, and potentially even higher when transient charging and resonance effects, as known to the person skilled in art, are included. For example, when HS transistor T2 is ON, voltage at node SW (e.g. source of 1'2) equals $V_{IN}$ and the gate of the HS transistor T2 can be at approximately $V_{IN}$Vddx, such as to turn T2 ON (e.g. Vddx>$V_{th}$ of T2, where Vth is the threshold voltage of HS transistor of T2). Hence somewhere within the HS level shifter (& output driver) (225) module of FIG. 2 where control timing pulses are provided to the gate of the HS transistor T2 via high voltage transistor devices, the high $V_{IN}$ voltage is dropped; that is, there is an active device within the module (225) which sees the high $V_{IN}$ voltage across two of its terminals. In the prior art gate driver (210) depicted in FIG. 2, such high voltage is handled by the high voltage transistors inside the HS level shifter (& output driver) (225) module of FIG. 2.

The high (breakdown) voltage transistors used in the prior art gate driver circuit (210) of FIG. 2 which are used to control the HS transistor T2 can be transistors such as high voltage MOSFETs, bipolar, HEXFETs, LDMOS, or other types of (control) transistors known to the person skilled in the art. Such high voltage transistors can have an FOM and other switching characteristics that do not match the characteristics of the GaN FETs of the LS transistor T1 and HS transistor T2 used in the high voltage stack depicted in FIG. 1. For example, their FOMs can be up to 10 times worse (higher) than the FOM of the GaN FETs T1 and T2. Therefore, much of the benefit of the GaN FETs of the exemplary prior art circuit depicted in FIG. 2 can be lost due to the lower performance characteristics of the high voltage transistors controlling the GaN FETs (LS transistor T1 and HS transistor T2). Such high voltage transistors can be expensive compared to low voltage transistors. Furthermore, each of the mentioned type of high voltage transistors may have other features such as cost, availability or complexity that could make it undesirable in certain high voltage applications.

It can therefore be desirable to control the high voltage GaN FETs with low voltage devices such as, for example, standard Si MOSFETs. By using low voltage MOSFETs, low cost, high precision and high volume CMOS manufacturing techniques can provide the necessary control while keeping the performance advantages provided by the GaN FET transistors, thereby eliminating the need for more exotic, high voltage transistors in the control circuit (e.g. gate driver). It can also be desirable to use low voltage MOSFETs in the control circuits because single chip embodiments are enabled as additional control or signal processing capabilities can be integrated within a same chip. The person skilled in art can appreciate such integration as single chip devices (e.g. monolithic integration) typically offer the most reproducible solutions possible in the electronics arts.

According to an aspect of the present disclosure systems, devices and methods are provided to enable such an integrated control system for controlling high voltage devices using exclusively low (breakdown) voltage transistors. According to one exemplary embodiment of the present disclosure later described, low voltage (e.g. less than 5 V) SOI MOSFETs can be used to create a gate driver circuit capable of controlling GaN FETs operating with a $V_{IN}$ voltage of 20-100V or above. In particular, a novel level shifter circuit is presented which when integrated in the gate driver circuit can enable such gate driver circuit to operate using only low voltage transistors. In other words, the level shifter according to the various embodiments of the present disclosure can drop the high $V_{IN}$ voltage without impressing that high voltage on any transistors.

Figure 3A:
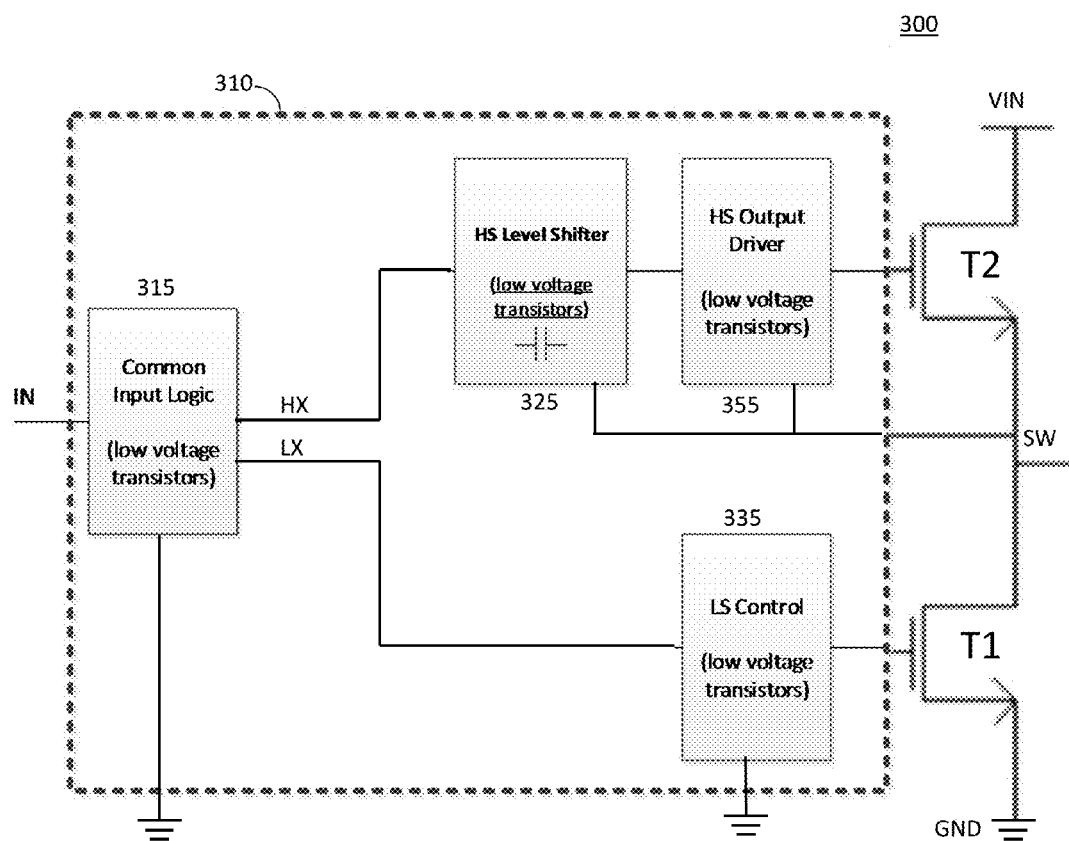
FIG. 3A shows a block diagram of a gate driver circuit according to an embodiment of the present disclosure which can be used to control the low side and the high side of the high voltage stacked transistors of FIG. 1. The gate driver circuit of FIG. 3A comprises an HS level shifter, which according to an embodiment of the present disclosure, can control high voltage devices by using only low voltage transistors. In the exemplary implementation depicted in FIG. 3A, the HS level shifter is used to control the high side transistor of the high voltage stacked transistors of FIG. 1.

FIG. 3A shows a block diagram of a gate driver circuit (310) according to an embodiment of the present disclosure which can be used to control the LS transistor T1 and the HS transistor T2 of the high voltage stacked GaN transistors of FIG. 1. In contrast to the prior art gate driver circuit (210) of FIG. 2 where a HS level shifter (225), using high voltage transistors, is used to handle the high voltage drop associated with the high voltage $V_{IN}$, the gate driver (310) uses an innovative HS level shifter (325) according to an embodiment of the present disclosure to perform the same high voltage drop task without using high voltage transistors. In all blocks (315, 325, 335, 355) of the gate driver (310) shown in FIG. 3A, including the HS level shifter (325), all constituent transistors handle only low voltages, e.g. between their sources and drains, and therefore low breakdown voltage transistors can be used for implementing such gate driver (310). As can be seen in the block diagram of FIG. 3A, the gate driver (310) according to an embodiment of the present disclosure, can include a common input logic circuit (315), high side control circuits (325, 355) and a low side control circuit (335). As will be described below, embodiments of the current disclosure couple the input low voltage (timing) control signals (e.g. provided at the input IN terminal of the gate driver circuit (310) and further processed via the common input logic circuit (315)) to the high side control circuits (e.g. 325, 355) through capacitors which can block the high voltage. Such coupling can allow dielectric isolation between circuits on a same die, with high voltage circuits used, for example, in the HS control blocks (325, 355), operating with respect to a reference potential (e.g. voltage at node SW) which can be significantly larger than the reference potential (e.g. GND) used in the low voltage circuits used, for example, in the LS control circuit (335) and the common input logic block (315). A person skilled in the art readily recognizes that magnetic coupling or optical coupling between the low voltage and high voltage domains (e.g. circuits) can also be utilized in place of the capacitive coupling. In general any type of coupling that can provide galvanic isolation (non-galvanic coupling)

between the low voltage and high voltage circuits can be used in the embodiments according to the present disclosure. Capacitive coupling can be both cheaper and easier to integrate into single chip solutions than alternate couplings. For these reasons, several embodiments of the present disclosure describe capacitive coupling as a preferred embodiment, where the capacitive coupling is used both for edge detection and DC blocking between the high voltage and the low voltage circuits.

Figure 3B:
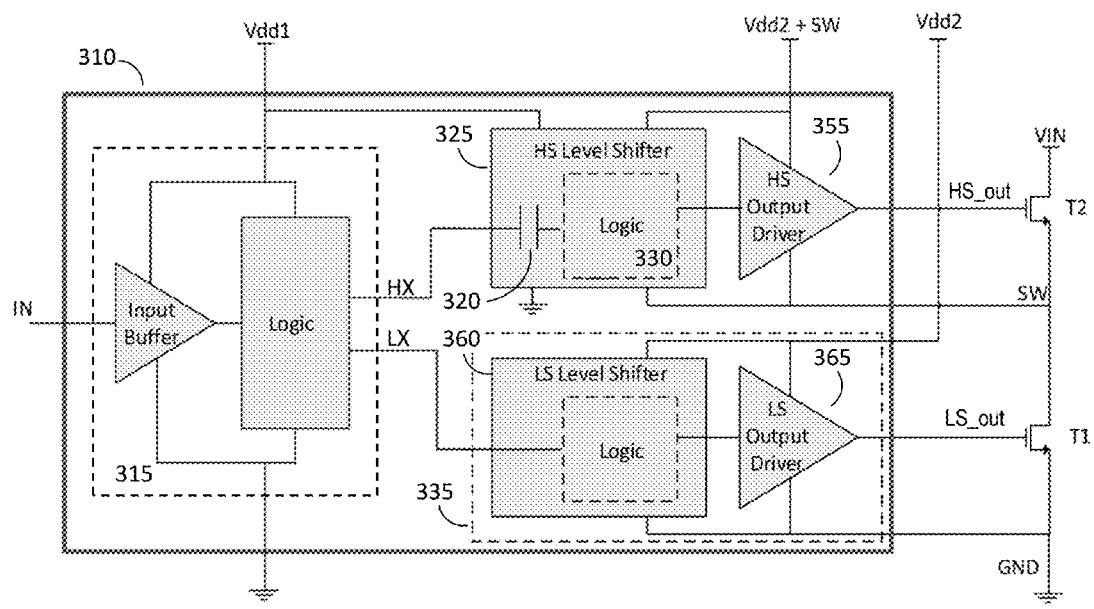
FIG. 3B shows a more detailed version of the gate driver circuit of FIG. 3A, including a more detailed representation of the HS level shifter of the gate driver circuit which is used to control the high side transistor of the high voltage stacked transistors of FIG. 1.

FIG. 3B shows a more detailed version of an exemplary embodiment according to the present disclosure of the gate driver circuit (310) of FIG. 3A. In particular, capacitive coupling within the HS level shifter (325) is shown, which capacitive coupling (as provided by the DC blocking edge detection circuit 320) is used to decouple the DC content (e.g. DC blocking) between the HS level shifter (325) and the common input logic circuit (315) while providing relevant control timing information associated to the input signal IN to the HS level shifter circuit (325) by edge detection. Such control timing information can subsequently be processed by circuitry, including logic circuitry, in the Logic block (330) of the HS level shifter (325). Furthermore, FIG. 3B shows the supplies and reference potentials to the high side control circuits (325, 355), the low side control circuit (335), the common input logic circuit (315) and the LS transistor T1 and the HS transistor T2 of the high voltage stacked transistors of FIG. 1. As can be seen in FIG. 3B, the common input logic circuit (315), and the low side control circuits composed of the LS level shifter (360) and the LS output driver (365) are provided with a low voltage supply Vdd1 and a reference potential GND (e.g. reference zero volts), whereas the high side control circuits (325, 355), composed of the HS level shifter (325) and the HS output driver (355), are provided with a supply voltage Vdd2+SW and a reference potential SW, where the reference potential SW is the voltage at the common node SW and can be up to a high voltage $V_{IN}$ above the reference potential GND of the low voltage circuits (note that the HS level shifter circuit (325) can additionally be provided with Vdd1 and GND as depicted in FIG. 3B and explained in later sections of the present disclosure). Therefore, the low voltage transistors used in the low side circuits (controlling the LS transistor T1) and the low voltage transistors used in the high side circuits (controlling the HS transistor T2) of the gate driver (310) can be subjected to a low voltage excursion equal Vdd1 or Vdd2. It should be noted that both Vdd1 and Vdd2 represent low voltage supplies which can be same or different. Furthermore, for simplicity reasons, the supply voltage Vdd2+SW provided to the high side control circuits described in the present disclosure can be annotated as $V_{DD}$, such as $V_{DD}$=Vdd2+SW.

As can be seen in FIG. 3B, the input signal IN to the gate driver (310) can be processed by the common input logic circuit (315) of the gate driver (310) and generate two signals, LX and HX, where the LX signal can be fed to the low side control circuit (335) of the gate driver (310), composed of the LS level shifter (335) and the LS output driver (365), to generate a control signal for the gate of the low side transistor (T1); and the HX signal can be fed to the high side control circuits (325, 355) of the gate driver (310), composed of the HS level shifter (325) and the HS output driver (355), to generate a control signal for the gate of the high side transistor (T2). The HS output driver (355) outputs a signal HS_out, which has the required amplitude and drive strength (e.g. current) to drive the high side transistor (T2). The HS_out signal output by the HS output driver (355) contains the same timing information as provided by its input signal, the input signal being provided by the Logic block (330) of the HS level shifter (325). According to some embodiments of the present disclosure, signals LX and FIX can be a same signal, except for a desired delay, and therefore can contain the same timing information.

Figure 4A:
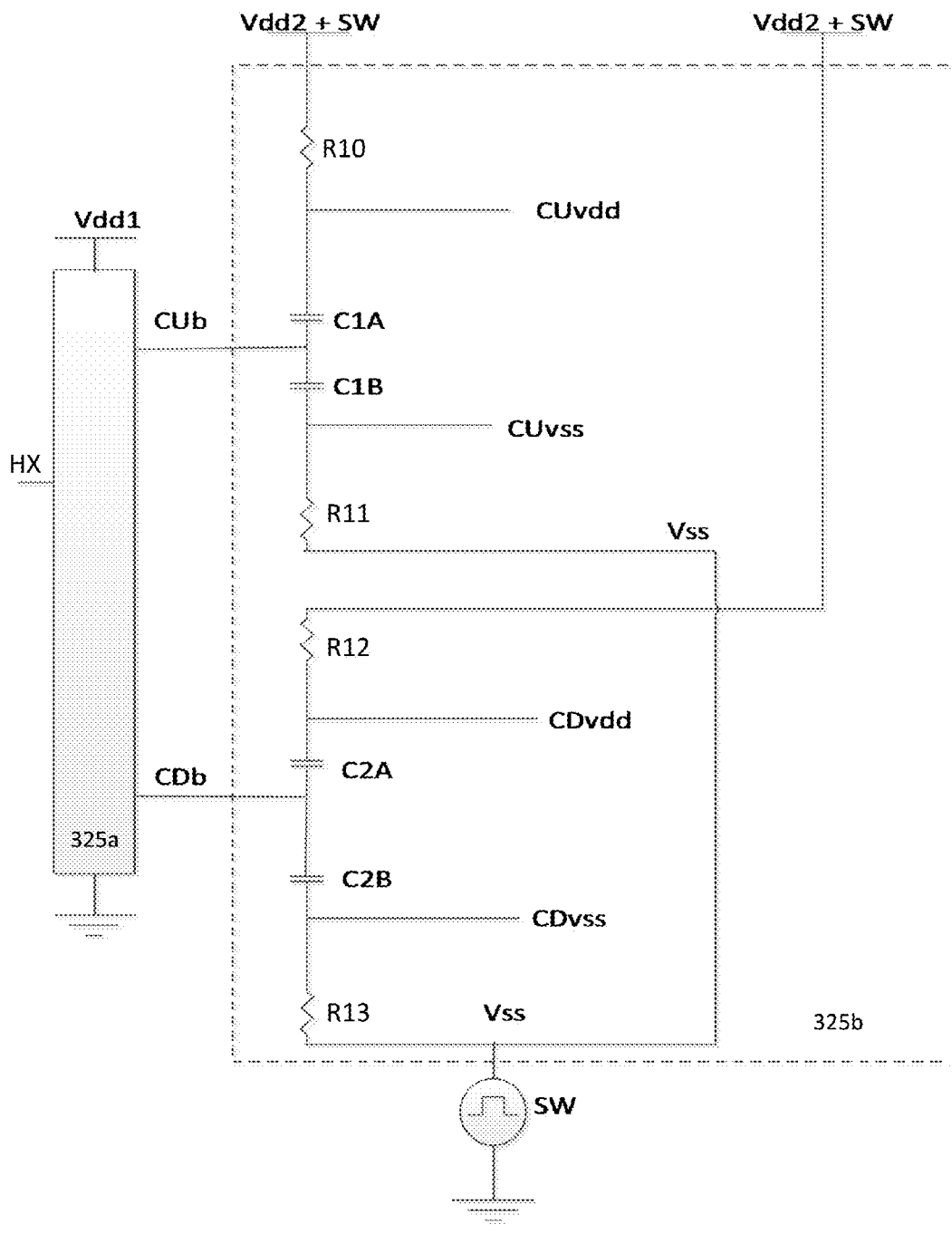
FIG. 4A shows a circuital representation of an input stage of the HS level shifter according to an embodiment of the present disclosure depicted in FIGS. 3A-3B, where capacitive coupling is used for edge detection to provide control information to the HS level shifter and to provide DC blocking.
Figure 4B:
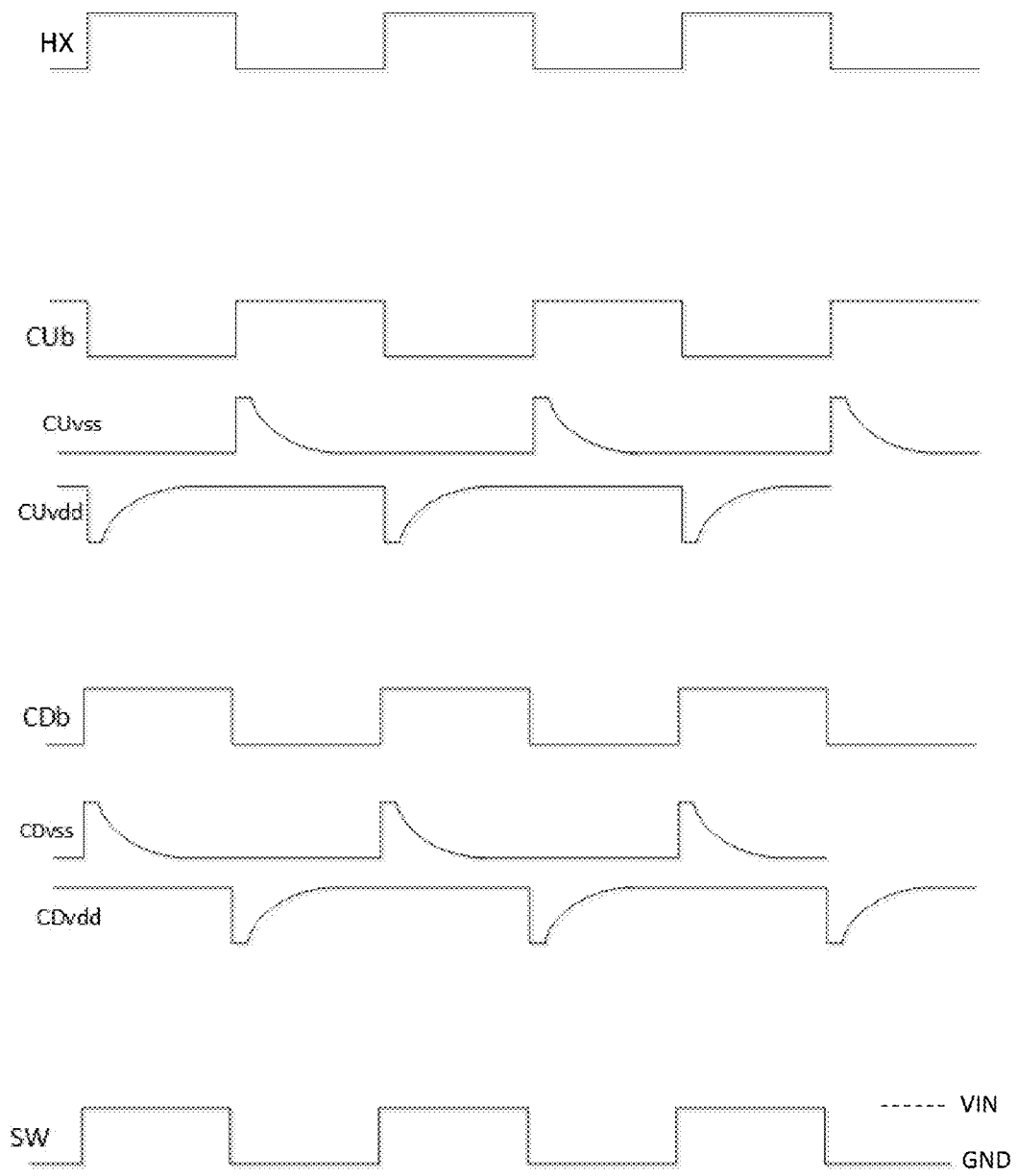
FIG. 4B shows timing diagrams of signals at various nodes of the HS level shifter depicted in FIG. 4A.

FIG. 4A shows a circuital representation of an input stage of the HS level shifter (325) of FIGS. 3A-3B according to an embodiment of the present disclosure, and FIG. 4B depicts timing diagrams of various signals of the circuit represented in FIG. 4A. As can be seen in FIG. 4A, the input stage of the HS level shifter (325) can comprise an input signal conditioning portion (325a), which can operate between Vdd1 and GND, generating two complementary signals, Cub and CDb, based on the input signal HX, and a capacitive signal decoupling portion (325b) which can operate between Vdd2+SW and SW and whose functional description is provided in the following sections of the present disclosure. It should be noted that although the circuit (325a) is shown as part of the HS level shifter (325), according to some embodiments of the present disclosure, circuit (325a) can be separate from (325) and even part of circuit (315).

The HS level shifter circuit, whose input section is represented in FIG. 4A, can allow a low voltage circuit (e.g. (315) of FIGS. 3A-3B) to control and operate high voltage control circuits (e.g. via T1, T2 and $V_{IN}$) and can be further referred to in the present disclosure as a low voltage transistor level shifter (LVTLS), or "level shifter". In the particular implementation of FIGS. 3A-3B where such level shifter controls operation of the high side (HS) transistor (T2), the level shifter can be referred to as HS-LVTLS, or simply as the HS level shifter. The level shifter of FIG. 4A allows for signals to be driven between elements that are separated by high voltages (e.g. $V_{IN}$), meaning the low voltage signals have their DC reference (e.g. reference potential) level shifted up or down along with the common node SW. This is schematically represented in FIG. 4A by a switching reference potential SW (feeding a reference line labelled $V_{SS}$), which as described in earlier sections of the present application can switch between $V_{IN}$ and ground (GND) as a function of the alternating ON/OFF states of transistors T1 and T2.

According to further embodiments of the present disclosure, the level shifter represented in FIG. 4A (except the input portion (325a) of the level shifter) can float up and down with the level of the reference potential SW (=$V_{SS}$) and can be isolated from GND (e.g. reference potential of the low voltage circuits of FIGS. 3A-3B and (325a)). This can allow the level shifter to operate using its constituent low breakdown voltage transistors in spite of high voltage excursions of 20-100V or more at the reference potential SW (=$V_{SS}$) with respect to the reference potential GND. During operation of the level shifter, the constituent low voltage transistors are subjected to internal voltage excursions (e.g. at their source, gate and drain terminals) not larger than a low voltage supply (e.g. Vdd2 of FIG. 3B). Capacitive isolation between the common input logic circuit (315) and the HS level shifter circuit (325, 355), as described in the prior sections of the present disclosure, can be provided by capacitors $C_{1A}$, $C_{1B}$, $C_{2A}$ and $C_{2B}$ of FIG. 4A (later described).

According to an exemplary embodiment of the present disclosure the level shifter (e.g. HS level shifter, LS level shifter) is fabricated, in its entirety or partially, in Silicon on Insulator (SOI) CMOS with an SOI substrate capable of withstanding the maximum DC voltage (e.g. $V_{IN}$ 20-100 V in this example) excursion at the reference potential SW with respect to the GND without conducting current or breaking down. According to a further exemplary embodiment of the present disclosure, the level shifter can be fabricated, in its entirety or partially, using silicon on sapphire (SOS) fabrication technology, as described, for example, in U.S. Pat. No. 5,416,043, issued on May 6, 1995, and in U.S. Pat. No. 5,600,169, issued on Feb. 4, 1997, whose disclosures are included herein by reference in their entirety. According to further exemplary embodiments of the present disclosure, fabrication technologies which can provide junction isolation between low voltage active circuits (e.g. transistors) and the corresponding substrate can also be used to fabricate the level shifter. The person skilled in the art will recognize that bulk silicon (Si) can provide such junction isolation between low voltage active circuits and the substrate.

With further reference to FIG. 4A, operation of the HS level shifter (325) according to the various embodiments of the present disclosure is described using the corresponding timing diagram of FIG. 4B. Signal HX of FIG. 4B represents an input timing control provided to the single-ended input terminal HX of a low voltage circuit (e.g. (325a) of FIG. 4A). The signal HX can be represented by a square wave signal (e.g. of a same or different duty cycle) which can be derived, for example, from a pulse width modulator (not shown but easily understood by a person skilled in the art to be to the left of IN input terminal in FIGS. 3A-3B). Signal HX is converted, within the input stage circuit (325a) of the HS level shifter (325), from a single-ended signal to a differential signal represented by CUb and CDb in FIGS. 4A-4B, with CDb being an inverse, or logic NOT function, of CUb. The reason for creating the differential, and inverted, form of the HX signal is described below. It should be noted that although the following sections will assume that signals CUb and CDb are inverted versions of one another, according to further exemplary embodiments of the present disclosure, such signals can include a time shift (e.g. delay), such as one is an inverted and time shifted version of the other. The time shift can be used, for example, to compensate for differences in propagation delays between paths taken by the two signals Cub and CDb.

As can be seen by considering both the circuit diagram of FIG. 4A and the timing diagram of FIG. 4B, CUb is applied between capacitors C1A and C1B and CDb is applied between capacitors C2A and C2B. It should be noted that the positive edge of CUb aligns with the negative edge of CDb.

At the positive edge of CUb, a positive pulse signal is induced at nodes CUvss and CUvdd. Since prior to the induced positive pulse signal, node CUvss is at a low level (i.e. $V_{SS}$=SW), the positive pulse signal induced at node CUvss brings the node to the high level (i.e. between $V_{SS}$=SW and $V_{DD}$=Vdd2+SW). At the same time, since prior to the induced positive pulse signal, node CUvdd is at a high level, the positive pulse signal induced at node CUvdd attempts to increase the level above $V_{DD}$=Vdd2+SW, but the Vdd2 power supply limits its size. Therefore, the positive edge of CUb causes CUvss to transition from lower (SW) to higher ($V_{DD}$) level, but CUvdd stays at a high level. According to various embodiments of the present disclosure described in the following sections, the CUvss transition between the lower level (SW) and the higher level (Vdd2+SW) can be used to trigger digital circuitry that latches the timing of CUb. It should be noted that pull-up resistors, R10, R12, and pull-down resistors R11, R13, provide steady-state voltage levels to the signals at nodes CUvdd, CDvdd, CUvss and CDvss respectively. As depicted in the timing diagram of FIG. 4B, the appropriate edge of the signals CUb and CDb will cause the voltages at these nodes to transition to the opposite state. Selection of the values of resistors R10-R13 can be made based on a number of design constraints, such as, for example; a desired value of an associated RC time constant provided by the combination of a resistor R10-R13 at a node CUvdd-CDvss and a corresponding capacitor C1A-C2B, a desired signal level at nodes CUvdd-CDvss, and a desired physical size of capacitors C1A-C2B. The person skilled in the art readily knows how to select the values of the capacitors C1A-C2B and resistors R10-R13 given specific design constraints.

Aligned with the positive edge of CUb is the negative edge of CDb, and therefore at the same time that the positive pulse signal is induced at nodes CUvss and CUvdd, a negative pulse signal is induced by CDb at nodes CDvss and CDvdd, thus creating signals at those nodes which are complementary to signals created at nodes CUvss and CUvdd. As can be seen in the corresponding timing diagram of FIG. 4B, such complementary signals have the same shape, but go in opposite directions (inverted signals) and start at either $V_{DD}$ (=Vdd2+SW) or Vss. For example, signals at nodes CUvss and CDvdd are complementary (e.g. inverted) as well as signals at nodes CUvdd and CDvss. Also, for example, at the leading edge of CUb, signal at node CUvss switches from $V_{SS}$ to $V_{DD}$ and subsequently gradually discharges to $V_{SS}$, and at the trailing edge of CUb, signal at node CUvdd switches from $V_{DD}$ to $V_{SS}$ and subsequently gradually charges to $V_{DD}$.

It should be noted that the signals represented in the timing diagram of FIG. 4B can have different DC offsets corresponding to the reference potential where a corresponding circuit operates. For example, signals HX, CUb and CDb have a zero DC offset since the corresponding circuits operate with respect to the reference potential GND, whereas signals CUvss, CUvdd, CDvss and CDvdd have a DC offset equal to the level of SW, since the corresponding circuit (e.g. HS level shifter) operates with respect to the reference potential $V_{SS}$=SW. The CDvdd transition generate similarly to CUb but in the opposite direction. Therefore, the signal at node CDvdd has a transition from a high level (Vdd2+SW) to a low level (SW) that can be latched by subsequent circuitry. The reason for creating complementary transition is described below. It should be further noted that all signals shown in FIG. 4B (as well as in FIGS. 5B and 7B later described) have low voltage swings (such as being bounded by $V_{SS}$ and $V_{DD}$) except for signal at node SW, which has a HI level of $V_{IN}$ and a LOW level of GND, as indicated in FIG. 4B.

The complementary signals at nodes CUvss, CDvdd and CUvdd, CDvss eliminate false triggers caused by either the rising or falling level of the $V_{SS}$ reference (and therefore of the $V_{DD}$ as well, since $V_{SS}$=SW, and $V_{DD}$=Vdd2+SW) by providing two complementary (inverted) pulses for each transition of signal HX which includes timing information. For example, complementary (inverted) pulse signals at nodes CUvss and CDvdd each represent timing information on the falling edge of the signal HX, whereas complementary (inverted) pulse signals CUvdd and CDvss each represent timing information on the rising edge of the signal FIX.

During time periods when $V_{SS}$ is either rising or falling between $V_{IN}$ and GND, charging currents can be induced through capacitors C1A-C2B and therefore generate undesired positive or negative pulse signals at nodes CUvdd-CDvss. As will be seen in the following sections of the present disclosure, the pulse signals at nodes CUvdd-CDvss trigger additional logic that subsequently controls the high side GaN transistor T2. Therefore, any undesired (e.g. false) pulses can cause errors in the control signals which in turn can prevent proper control of the high side transistor which in turn can cause erroneous output voltage and degrade device reliability. By choosing both an upward and downward pulse (e.g. differential signal), and requiring both an upward and downward pulse to trigger a subsequent latch (as described in FIG. 7A through transistors M2-M5), the pulses derived from the HX signal (HX being derived from the IN signal) can be distinguished from the (false) pulses caused by rising or falling levels of Vss.

As seen in FIG. 4B, on rising edges of the HX signal, CUvss and CDvdd appear not to generate any pulses, and on falling edges of the HX signal, CUvdd and CDvss appear not to generate any pulses. In reality, during such transitions, some pulses may arise (for example, on a rising edge of the HX signal, at node CUvss, a small pulse signal going below the $V_{SS}$ level (i.e. SW) can be observed, and on a falling edge of the HX signal, at node CUvdd, a small pulse signal going above the $V_{DD}$ level (i.e. Vdd2+SW) can be observed). It follows that according to an embodiment of the present disclosure a clamp circuit (e.g. FIG. 6 later described) can be used to clamp and control such pulses rather than have them deliver charge (and therefore waste power) to $V_{SS}$ or $V_{DD}$.

Therefore, the level shifter according to the embodiment of the present disclosure converts the input signal square wave represented by HX in FIG. 4B, to complementary pulse signals at nodes CUvss, CUvdd, CDvss and CDvdd with corresponding pulse shapes and timings as shown in FIG. 4B. These complementary pulses track the timing information provided by the input signal at IN (leading and trailing edges of IN) while being at a DC level equal to SW which defines Vss. For example, such complementary pulses have a DC level equal to $V_{IN}$ when $V_{SS}$ is at $V_{IN}$ and have a DC level equal to GND when $V_{SS}$ is at GND. Hence, a person skilled in the art will recognize that the HS level shifter (325) according to various embodiments of the present disclosure drops the VIN high voltage across capacitors C1A, C1B, C2A and C2B.

It is pointed out that the pulse signals at CUb and CDb have a magnitude of a low voltage Vdd2 (e.g. in the range of 0-5 V and typically 0-2.5V) while the pulses CUvss, CUvdd, CDvss and CDvdd have a magnitude which can range between $V_{SS}$ and $V_{SS}$+Vdd2=SW+Vdd2=$V_{DD}$. Hence, no transistor within the gate driver circuit (310) using the described HS level shifter circuit handles the YIN high voltage across itself (e.g. between its drain and source terminals), in sharp contrast to prior art solutions in which high (breakdown) voltage transistors are used in place of the capacitive level shifter (HS level shifter (325)) according to the present embodiments. In the previously described embodiment according to the present disclosure where SOI MOSFETs are used as the low voltage transistors, the VIN high voltage is also handled by the insulating SOI substrate layer.

As can be seen by the pulse shapes in FIG. 4B, pulses generated at nodes CUvss, CUvdd, CDvss and CDvdd have long tails caused by the RC nature of the associated circuitry (due, for example, to R10, C1A, R11, C1B, R12, C2A, R13, C2B) with corresponding RC time constants. In some embodiments, it can be desirable to enable pulses as close together as possible, thereby enabling the largest ratio (i.e. duty cycle) between ON/OFF or OFF/ON at the input IN of the gate driver circuit (310) of FIG. 3B, such as generated, for example, by a pulse width modulator (PWM). However, the long tails of the pulses at nodes CUvss, CUvdd, CDvss and CDvdd can prevent obtainment of such large ratio. In the next paragraphs, a further embodiment of the present disclosure will be presented, where such tails are shortened using discharge transistors M6-M9 as depicted in FIG. 5A.

Figure 5A:
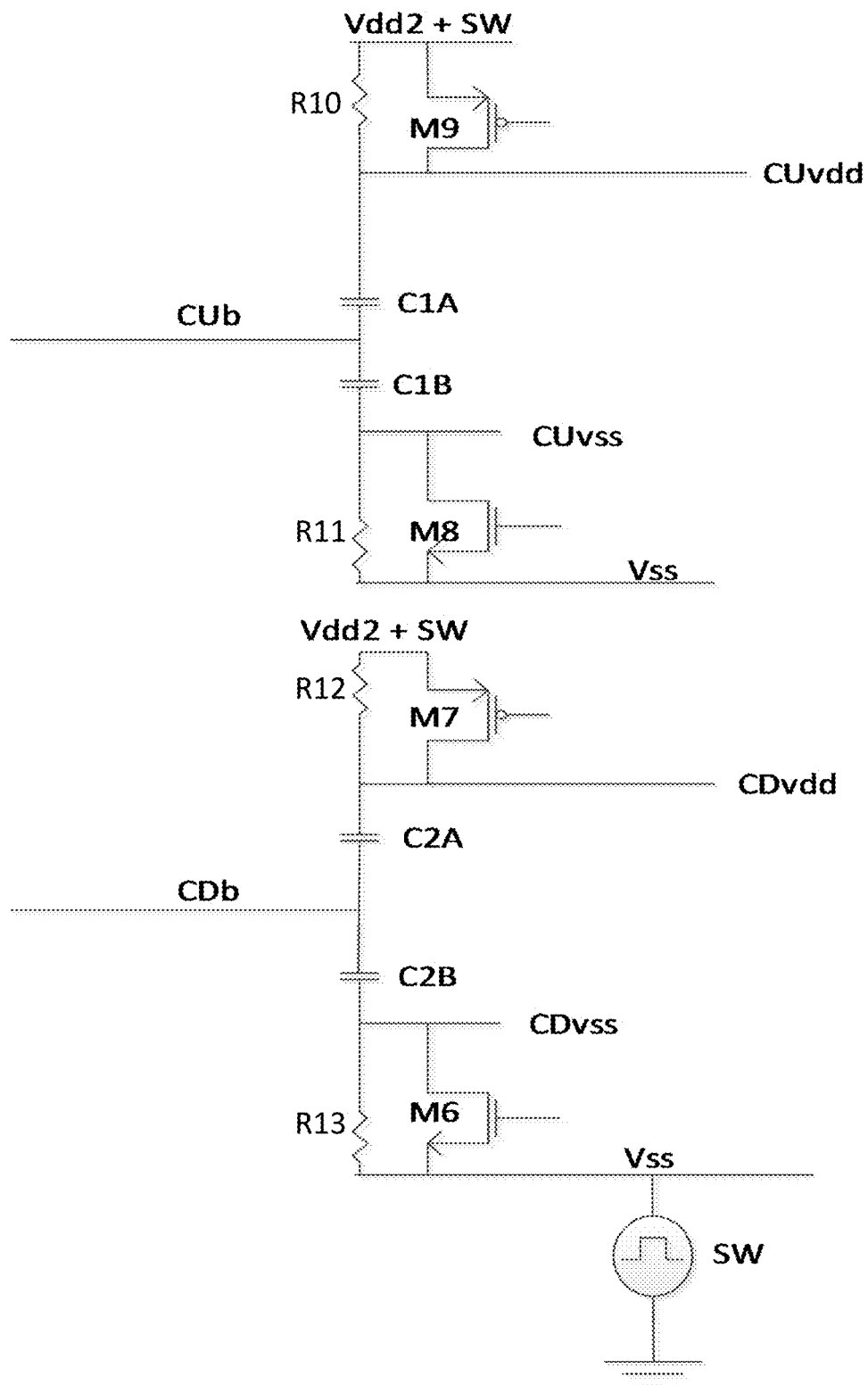
FIG. 5A shows additional circuitry to the HS level shifter of FIG. 4A, which according to an embodiment of the present disclosure can eliminate the tails of the pulses created at the various nodes of the low voltage level shifter.

FIG. 5A shows additional circuitry to the HS level shifter (325) of FIG. 4A, which according to an embodiment of the present disclosure can shorten the tails of the pulses created at nodes CUvss, CUvdd, CDvss and CDvdd and therefore can allow for shorter time between pulses. This is done by adding discharge transistors M6-M9 which are configured to short the isolation capacitors C1A-C2B either to $V_{SS}$ or to $V_{DD}$, thereby discharging any residual voltage tail they may have at the time of shorting (and therefore not discharged through a corresponding resistor R10-R13). For example, when discharge transistor M9 is turned on, it shortens node CUvdd to $V_{DD}$, thereby bypassing discharge via resistor R10, and when discharge transistor M6 is turned on, node CDvss is shorted to $V_{SS}$, and thereby bypassing discharge via resistor R13.

Figure 5B:
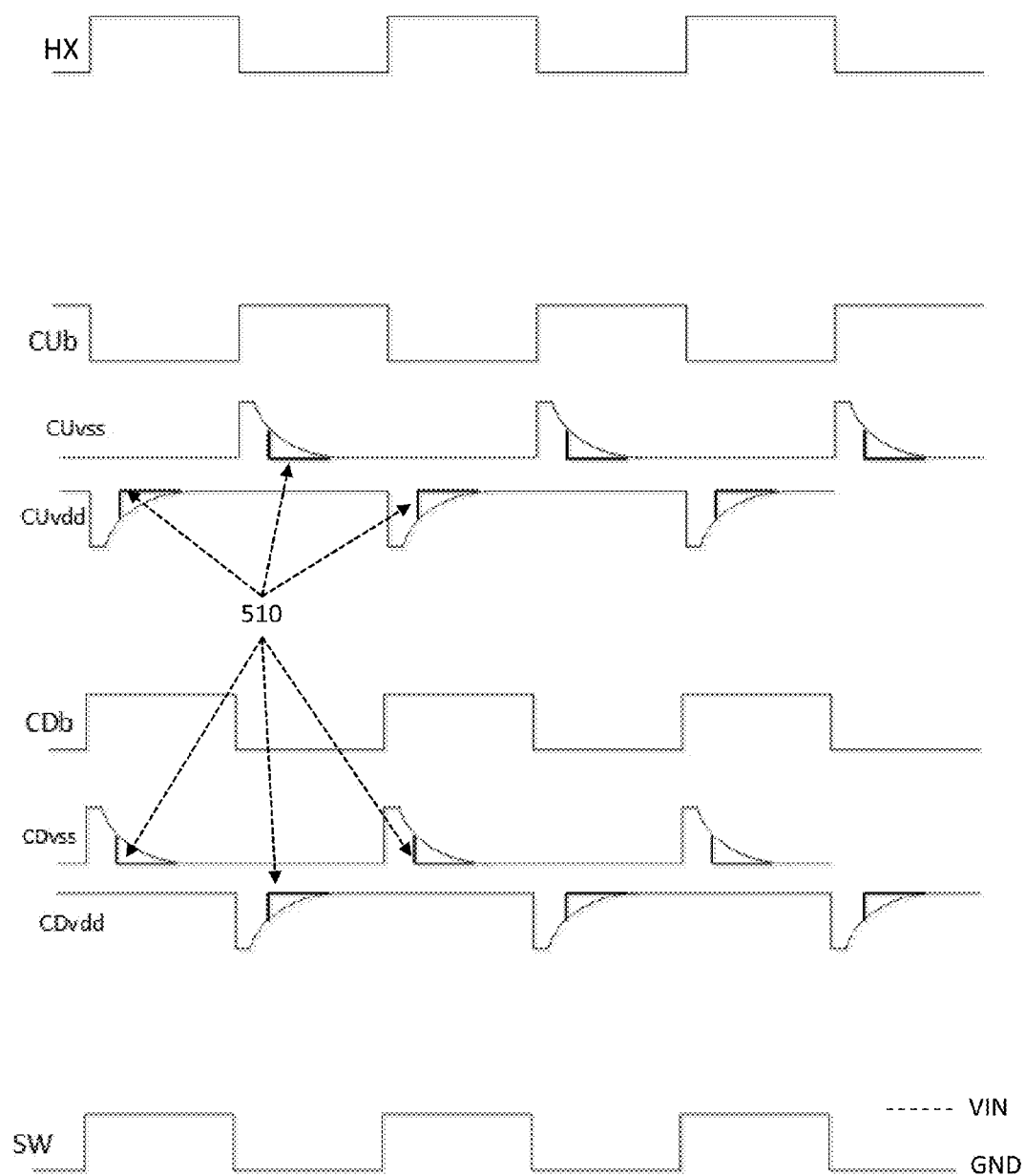
FIG. 5B shows timing diagrams of signals at various nodes of the HS level shifter depicted in FIG. 5A, where the additional circuitry removes the tails of the pulses.
Figure 8:
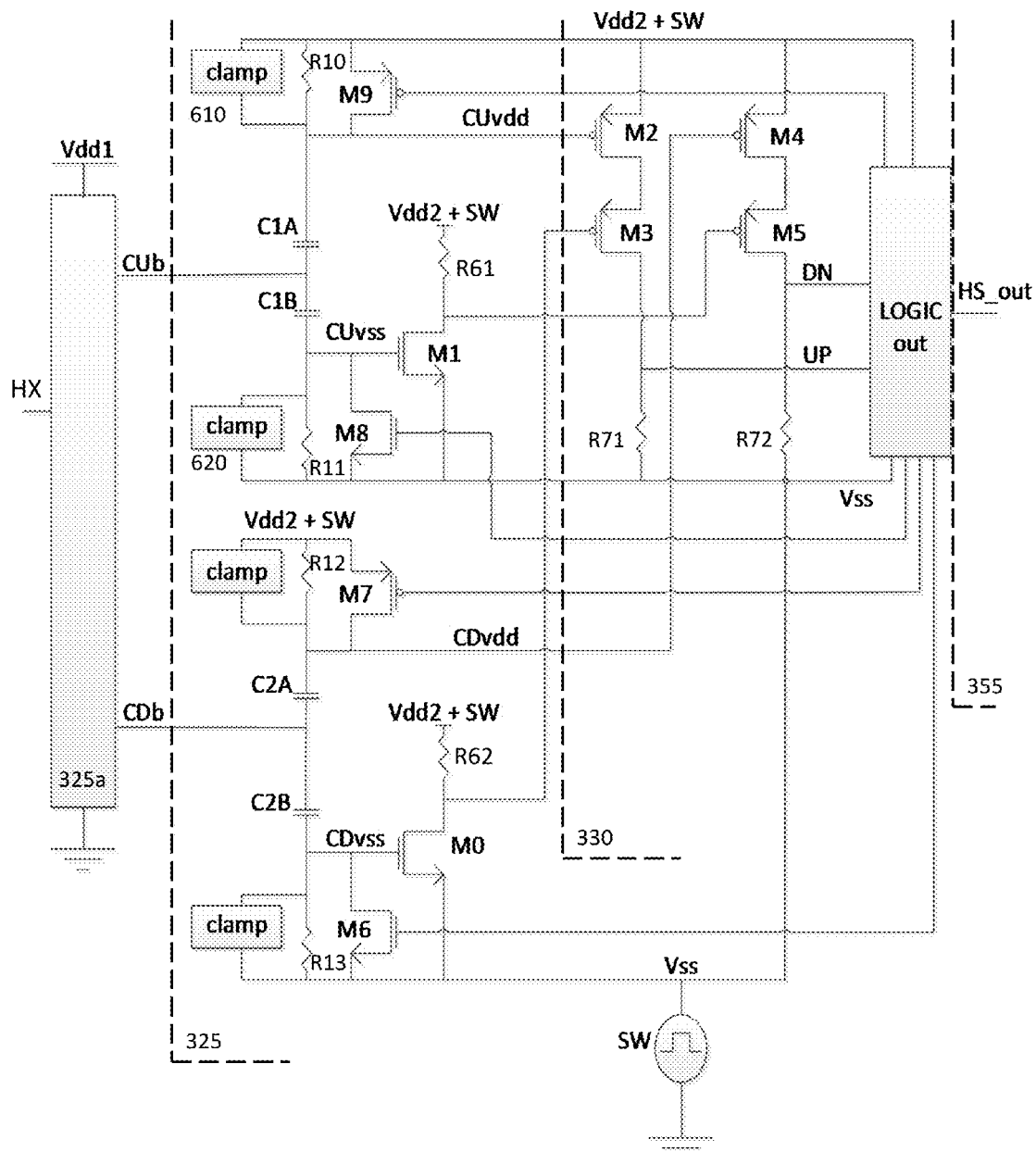
FIG. 8 shows a detailed circuital implementation of the various modules of the gate driver circuit of FIG. 3A used to control the high side high voltage transistor T2 of the stack depicted in FIG. 1.

The impact of the discharging transistors M6-M9 on the shapes of the pulses at nodes CUvss, CUvdd, CDvss and CDvdd can be seen as the bold lines (510) in FIG. 5B. As can be seen, such pulses keep their original shape (following an RC time constant associated to a corresponding capacitor-resistor pair C1A-C2B, R10-R13) until the discharge transistors are triggered after a certain period of time from the start a pulse, and then the voltages on CUvss, CUvdd, CDvss and CDvdd return to either $V_{SS}$ or $V_{DD}$, as shown by the bold lines in FIG. 5B. Although not shown in FIG. 5A, control signals to the discharge transistors M6-M9 can be provided at the gates of the discharge transistors. Such control signals can be generated, for example, in subsequent circuitry, such as circuitry contained in the LOGIC_out block of the Logic block (330) as depicted in FIG. 8.

Figure 6A:
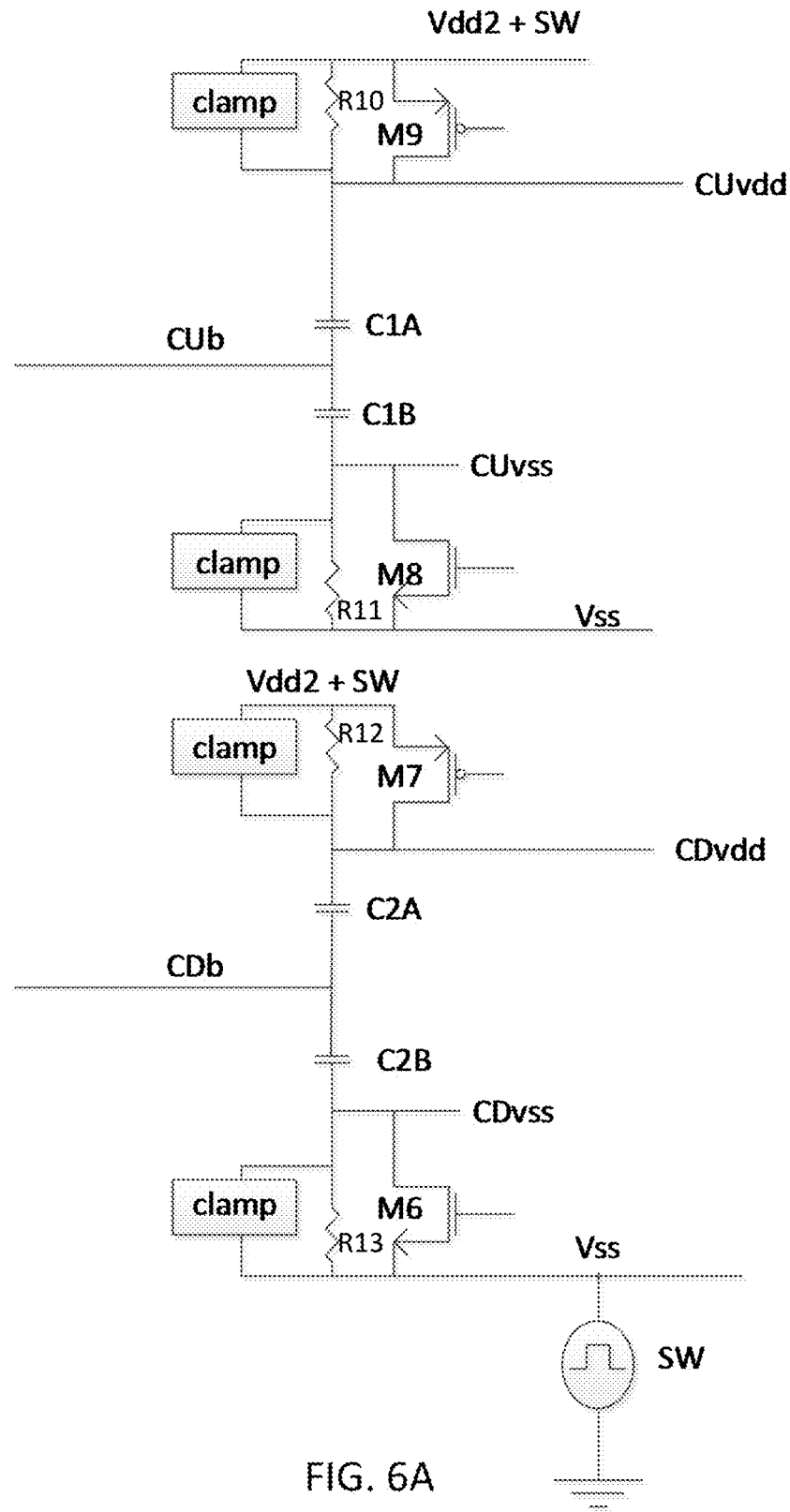
FIG. 6A shows a clamping circuitry added to the HS level shifter of FIG. 5A, where such clamping circuitry can protect various nodes of the HS level shifter from reaching voltage levels detrimental to the low voltage devices of the HS level shifter.
Figure 6B:
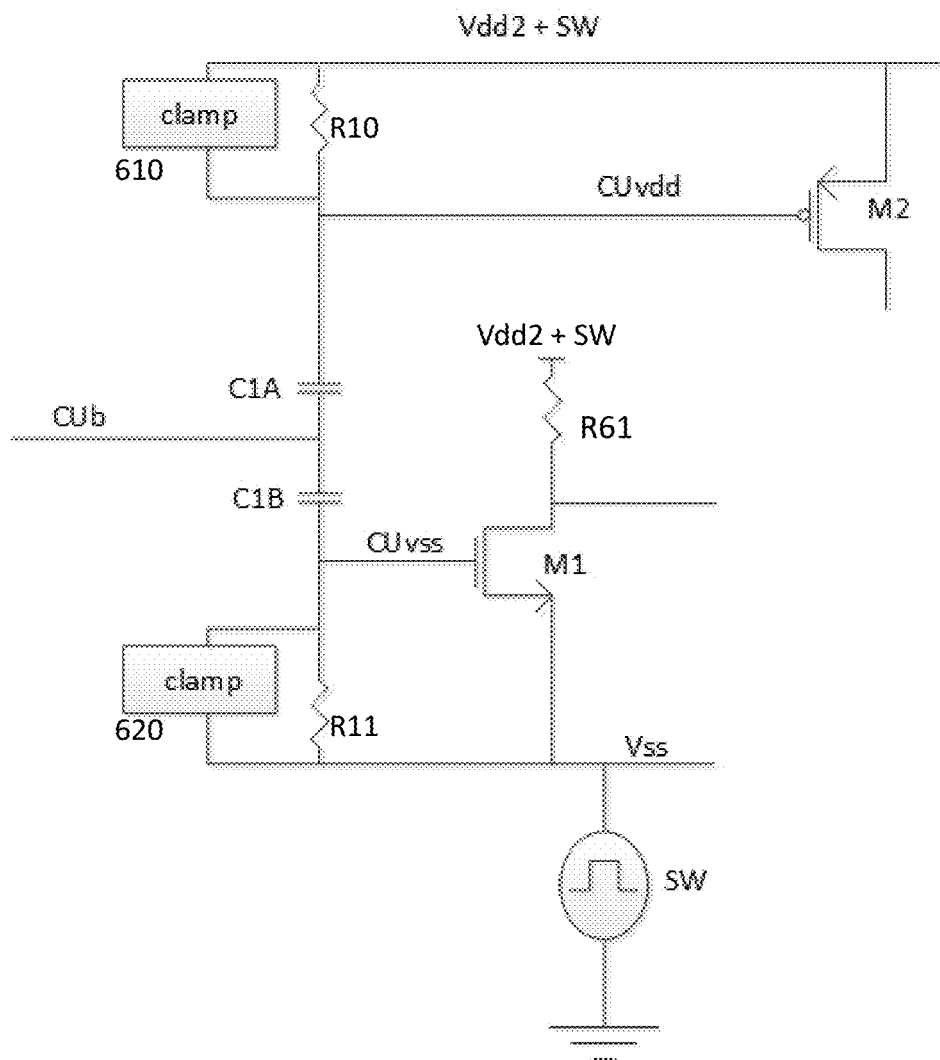
FIG. 6B shows the addition of inverter circuitry to a section of the HS level shifter of FIG. 6A.

With continued reference to the HS level shifter (325) according to the various embodiments of the present disclosure, FIGS. 6A and 6B are now described. As known to a person skilled in the art, and as mentioned in the prior sections of the present disclosure, capacitively coupled signals can force voltages on an output side of a capacitor to spike with a distinctive decay time known as an RC time constant, where R and C are the resistive and capacitive values of a corresponding simple RC circuit (e.g. R10-C1A as shown in FIGS. 4A, 5A and 6A). Such a voltage spike and a corresponding decay time which can alter, for example, a pulse shape at any of the nodes CUvss, CUvdd, CDvss and CDvdd, can cause several issues in the operation of the HS level shifter (325) according to the various embodiments presented in the prior sections, as described below.

As previously mentioned, negative or positive pulses can be forced onto $V_{SS}$ or $V_{DD}$, respectively. To control this effect, and according to a further embodiment of the present disclosure, a clamping circuit (clamp) can be added to the HS level shifter (325), as shown in FIG. 6A (one clamp per node), which actively limits the signals at nodes CUvss, CUvdd, CDvss and CDvdd to be between $V_{SS}$ and $V_{DD}$ for all values of $V_{SS}$ (as a voltage value of $V_{SS}$, tied to common node SW, can move from GND level to $V_{IN}$ level). The specific embodiment of the clamping circuit is described below.

The pulse signals at nodes CUvss, CUvdd, CDvss and CDvdd can be applied to logic gates to latch their values and to make them square wave in nature so as to allow control, for example, of the low side and high side high voltage stacked transistors T1, T2 of FIGS. 3A-3B. As mentioned above, rising or falling $V_{SS}$ or $V_{DD}$ value (as function of the voltage level at common node SW) can cause false pulses at nodes CUvss, CUvdd, CDvss and CDvdd, as the rising or falling level of $V_{SS}$ or $V_{DD}$ is directly coupled to these nodes through resistors R11, R10, R13 and R12 respectively, and delayed due to an associated RC time constant provided by the corresponding node capacitor C1B, C1A, C2B and C2A respectively. Such delay due to a node's RC time constant can create transition pulses at gates of a transistor which in turn can generate false transitions at the output signal HS_out.

Figure 6C:
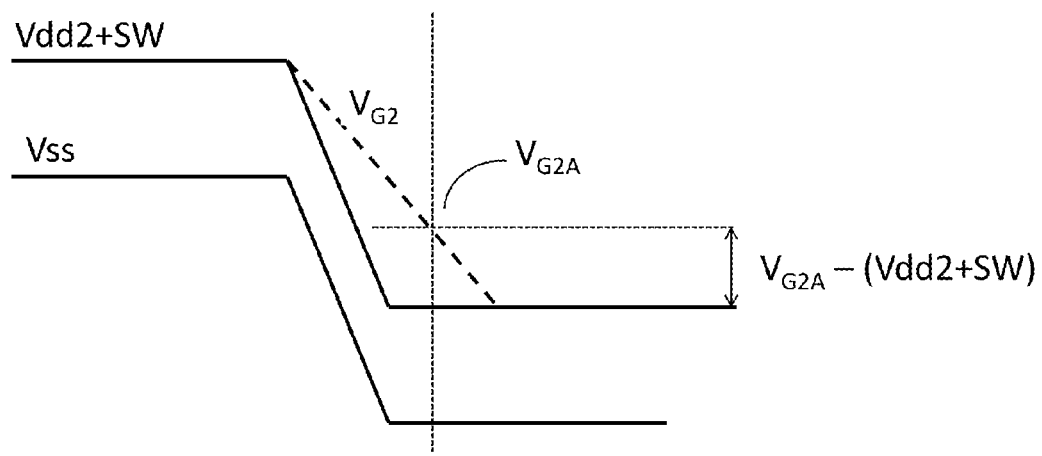
FIGS. 6C-6F show the instantaneous voltage at a gate of a low voltage transistor of the HS level shifter as a function of an RC time constant of a supply and reference potential of the HS level shifter.
Figure 6D:
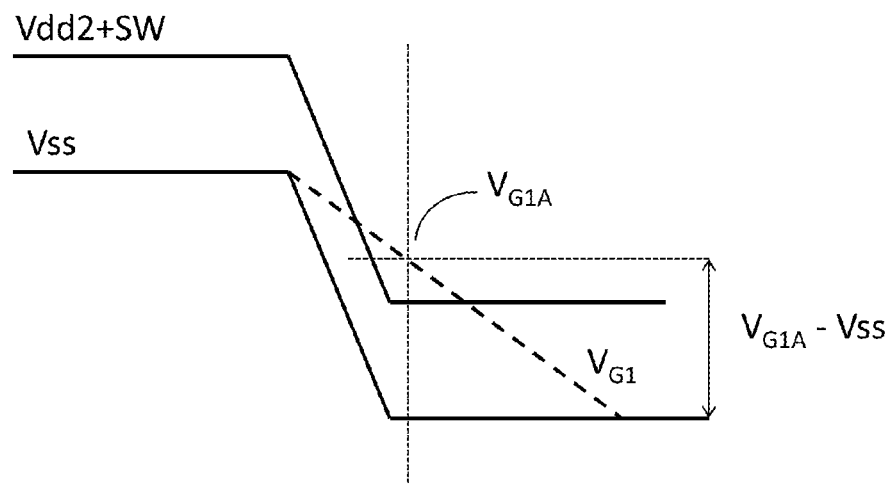
Figure 6E:
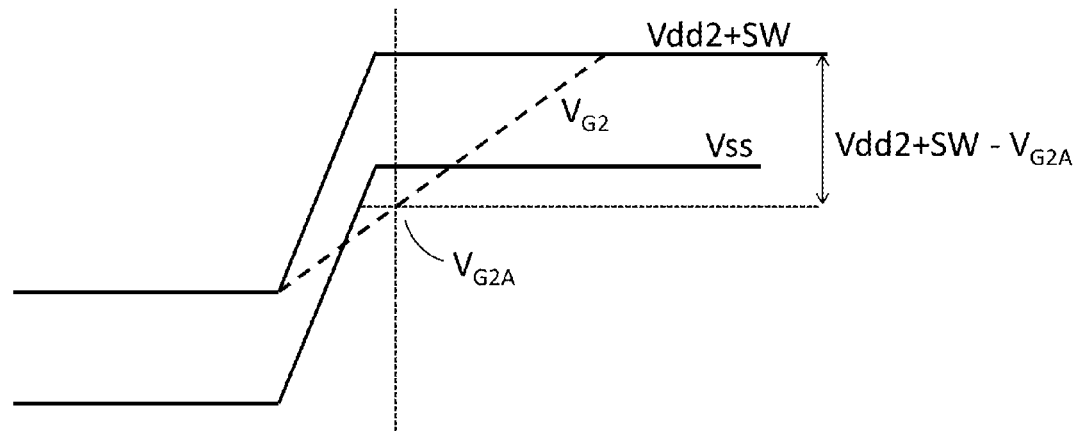

For example, considering the signal at node CUvdd, connected to the gate G2 of transistor M2, at a steady state level of $V_{DD}$. As $V_{SS}$ and $V_{DD}$ rise, as depicted in FIG. 6E, the voltage at node CUvdd follows an RC time constant as indicated by the dotted line $V_{G2}$ in FIG. 6E. Such voltage starts and ends with a corresponding steady state value which corresponds to a high level, but in between the steady states, the voltage transitions and can fall at voltage levels below or equal to the $V_{SS}$ level, as indicated by point $V_{G2A}$ in FIG. 6E. Such transition of the voltage level of the signal at node CUvdd from the steady state high, to a transitional state low, and back to a steady state high, can therefore create false negative pulses at the gate of transistor M2, which in turn can corrupt the timing control signal at output node HS_out. The person skilled in the art will understand that similar false pulses (positive pulses) can be observed during a falling level of the $V_{SS}$ and $V_{DD}$ voltages at nodes which have a low level steady state value, such as node CUvss, and as indicated in FIG. 6D.

Figure 7A:
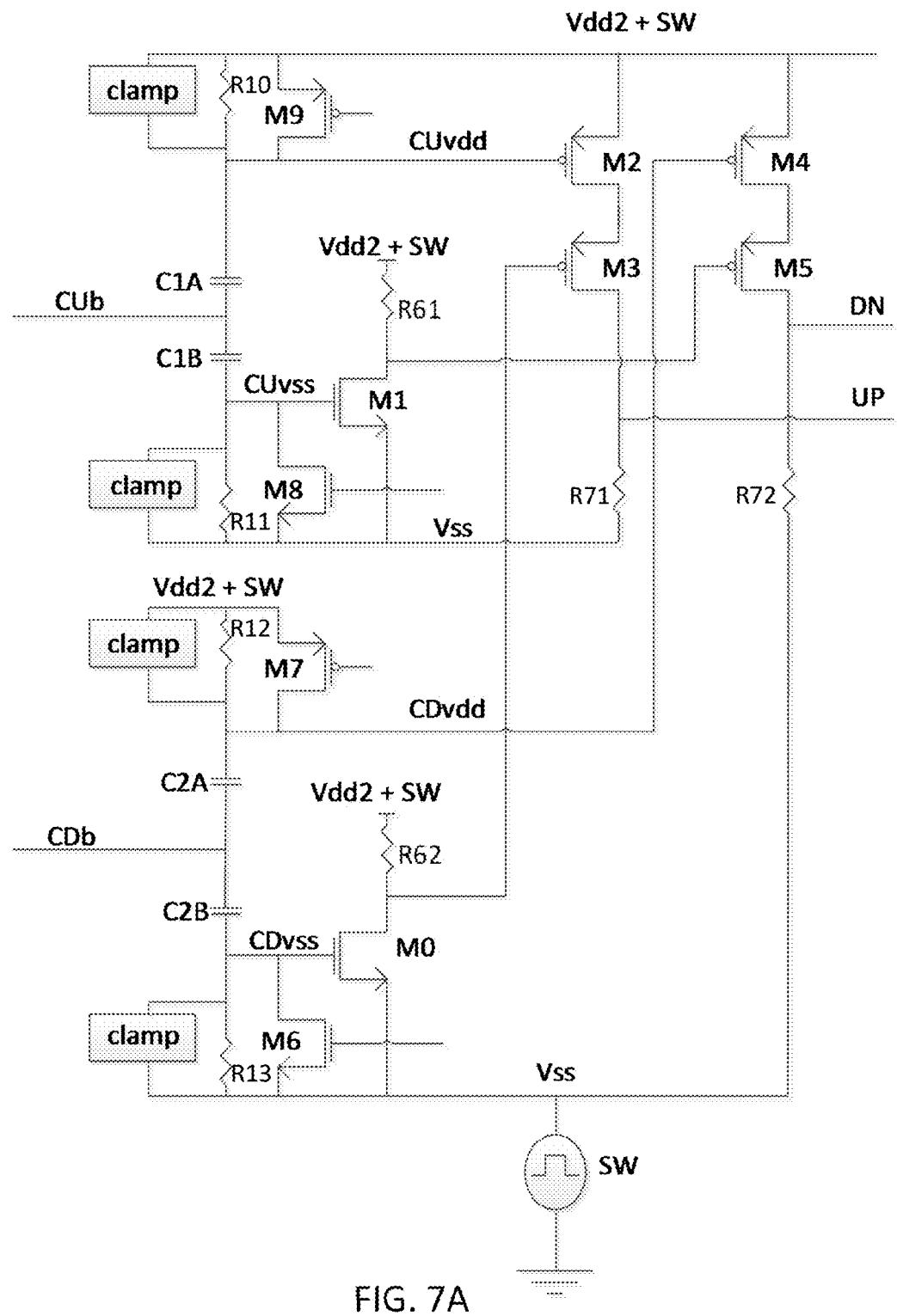
FIG. 7A shows additional circuitry to the HS level shifter of FIG. 6A, where such additional circuitry is used to create two complementary control signals.

The logic to ensure that no false triggers occur (e.g. due to false pulses) is discussed with reference to FIG. 7A which is later described, but it starts by inverting the signals at nodes CUvss and CDvss with inverters, as shown for the case of CUvss in FIG. 6B, where the inverters are composed of transistors M1 and M0, respectively, and their load resistors R61 and R62, respectively, prior to feeding the resultant signal to gates of subsequent logic. Such inversion of signals at nodes CUvss and CDvss is performed in order to get signals of a desired polarity for subsequent processing and provide complementary signals that enable a solution to false triggering due to false pulses. The other nodes, CUvdd and CDvdd, are applied directly to gates of subsequent logic, as depicted in FIG. 7A, and can have the same issue as described here with respect to the signals at nodes CUvss and CDvss. However, by applying complementary signal pairs CUvss/CDvdd and CDvss/CUvdd to logic gates M4/M5 and M2/M3, respectively, false triggers on either rising or falling $V_{SS}$ are prevented.

Figure 6F:
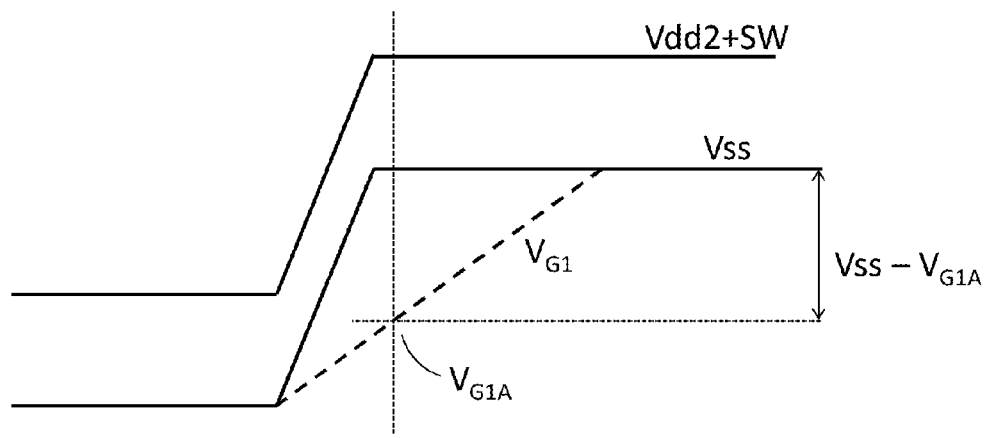

With continued reference to FIG. 6B, and as mentioned above, the node CUvss (denoted G1 in FIG. 6G later described) at the gate of transistor M1 can have a different time constant (e.g. due to a different equivalent RC circuit) than a time constant associated with a switching level of $V_{SS}$ and $V_{DD}$ (i.e. $Vdd_2$+SW). The same difference in time constants can also apply to node CUvdd (denoted G2 in FIG. 6G later described) at the gate of transistor M2 with respect to the switching level of $V_{SS}$ or $V_{DD}$. Therefore, due to such different time constants, an excessive voltage between the gate terminal of, for example, transistor M1, and $V_{SS}$ (e.g. reference potential) can occur, that exceeds the reliable operating voltage of the gate oxide layer of transistor M1 (e.g. $V_{DD}$-$V_{SS}$). As shown in FIGS. 6C and 6D for falling levels of $V_{SS}$ and $V_{DD}$, such high voltage can occur when the gate node (e.g. $V_{G1}$ of M1, $V_{G2}$ of M2 depicted in FIGS. 6C and 6D respectively) is at an instantaneous voltage ($V_{G1A}$, $V_{G2A}$) which is above $V_{DD}$. Similarly, as shown in FIGS. 6E and 6F for rising levels of $V_{SS}$ and $V_{DD}$, such high voltage can occur when the gate node (e.g. $V_{G1}$ of M1, $V_{G2}$ of M2 depicted in FIGS. 6E and 6F respectively) is at an instantaneous voltage ($V_{G1A}$, $V_{G2A}$) which is below $V_{SS}$. Therefore, the clamping circuit according to the embodiment of the present disclosure can provide protection to the level shifter circuitry by preventing the instantaneous voltages at nodes CUvss, CUvdd, CDvss and CDvdd from being outside the range defined by $V_{SS}$ and $V_{DD}$ (where $V_{SS}$=SW and $V_{DD}$=Vdd2+SW).

Figure 6G:
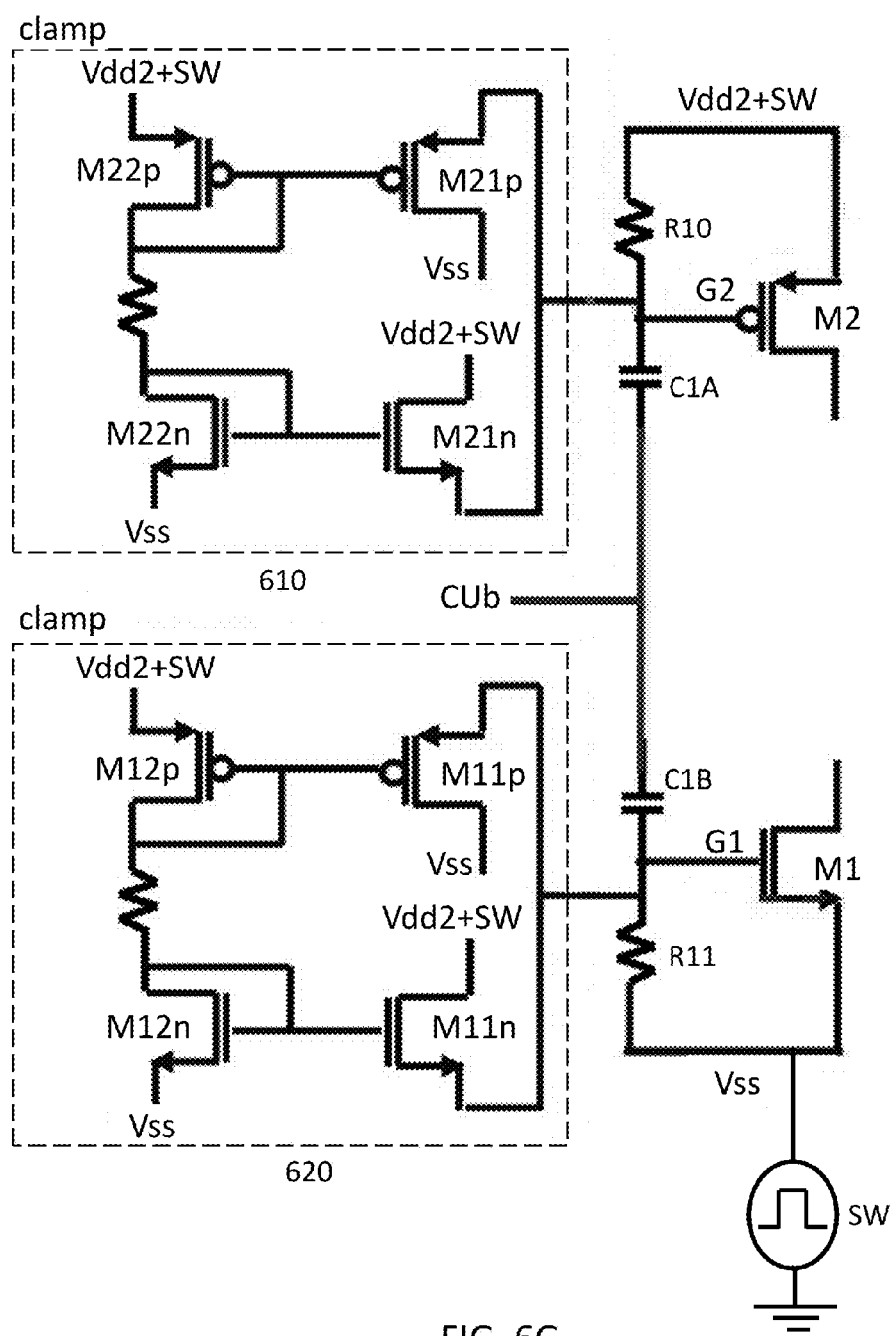
FIG. 6G shows further details of the clamping circuitry and interface to the rest of the HS level shifter.

An exemplary embodiment of a clamping circuit for use in the HS level shifter (325) of FIGS. 6A-6B is shown in FIG. 6G, where two identical clamping circuits 610 and 620 are used to protect the gates of transistors M2 and M1 respectively. It is pointed out that a person skilled in the art readily knows that other clamping circuits are possible and that the exemplary embodiment of the clamping circuit (610, 620) presented herein should not be construed as limiting the scope of the HS level shifter according to the various embodiments of the present disclosure. As shown in FIG. 6G, the exemplary clamping circuit (610, 620) can consist of four MOSFETS, 2 n-type (e.g. (M11n, M12n) and (M21n, M22n)) and 2 p-type (e.g. (M11p, M12p) and (M21p, M22p)). It is assumed for the purposes of describing the circuit that the two n-type and two p-type transistors are matched to each other in current handling capability (e.g. strength, drive), but opposite in polarity.

With continued reference to the exemplary clamping circuit (610, 620) shown in FIG. 6G, one of each type of the four MOSFETs of each clamping circuit has its gate tied to its drain (e.g. (M12n, M12p) of (620), and (M22n, M22p) of (610)), thereby putting them into the well-known diode-connected mode, which means that each of the diode-connected transistors (M12n, M12p) of (620), and (M22n, M22p) of (610) have I-V characteristics equivalent to those of a diode with a forward voltage, Vf, equal to the threshold voltage of the constituent MOSFET. Since each of the diode-connected transistors (M12n, M12p, M22n, M22p) is also connected to the gate of a corresponding same type transistor (M11n, M11p, M21n, M21p), such as, for example, diode-connected M22p transistor connected to the gate of the same type transistor M21p, and diode-connected M22n transistor connected to the gate of the same type transistor M21n, the gate of the corresponding same type transistor (M11n, M11p, M21n, M21p) is held at the diode forward voltage, Vf. This essentially clamps the gate voltage on the n-type transistors (M11n, M21n) and the p-type transistors (M11p, M21p) at their threshold voltage above $V_{SS}$ or below $V_{DD}$, respectively.

Reference will now be made to the two p-type transistors (M21p, M22p) of the top clamping circuit (610) shown in FIG. 6G. With the gate voltage of transistor M21p held at a threshold voltage below $V_{DD}$, transistor M21p starts to conduct when its source voltage rises above $V_{DD}$ (e.g. Vdd2+SW). This effectively clamps the source of transistor M21p at or below $V_{DD}$, and therefore clamps the gate voltage at node G2 of the transistor M2 to be at or below $V_{DD}$.

The two n-type transistors (M21n, M22n) of the top clamping circuit (610) shown in FIG. 6G behave in the same way as the two p-type transistors (M21p, M22p), except with positive threshold voltage (Vth) with respect to $V_{SS}$. More specifically, when the voltage at the gate node G2 of transistor M2 drops below $V_{SS}$, the n-type transistor M21n conducts since its source drops below $V_{SS}$ and therefore its gate to source voltage, Vgs, exceeds its threshold voltage and therefore transistor M21n conducts, thereby clamping the gate of transistor M2 to operate at or above the voltage level of $V_{SS}$.

Put together, the exemplary clamping circuit (610) shown in FIG. 6G ensures that the gate of transistor M2 does not operate outside the range defined by $V_{SS}$ and $V_{DD}$, as needed to ensure that the gates of any follow-on logic gates cannot see excess voltage as caused, for example, by the time constant difference of various nodes, as described in detail above and depicted in FIGS. 6C-6F. This is true before, during and after any rise or fall in levels of $V_{SS}$ and $V_{DD}$, in an absolute sense (as both these voltages depend on the switching voltage at node SW). In other words, as $V_{SS}$ and $V_{DD}$ charge up and down, the gates of the clamped circuits are held at all time in the range $V_{SS}$ to $V_{DD}$, thereby ensuring reliable operation of the HS level shifter circuit according to the various embodiments of the present disclosure.

A same clamping circuit (620) composed of transistors (M11n, M12n, M11p, M12p) can be applied to the gate of transistor M1 as depicted in the lower block of FIG. 6G. A same clamping circuit can also be used in all the blocks labeled "clamp" in FIGS. 6A, 6B, 7A and 8 to protect the various transistor devices used in these blocks.

Figure 7B:
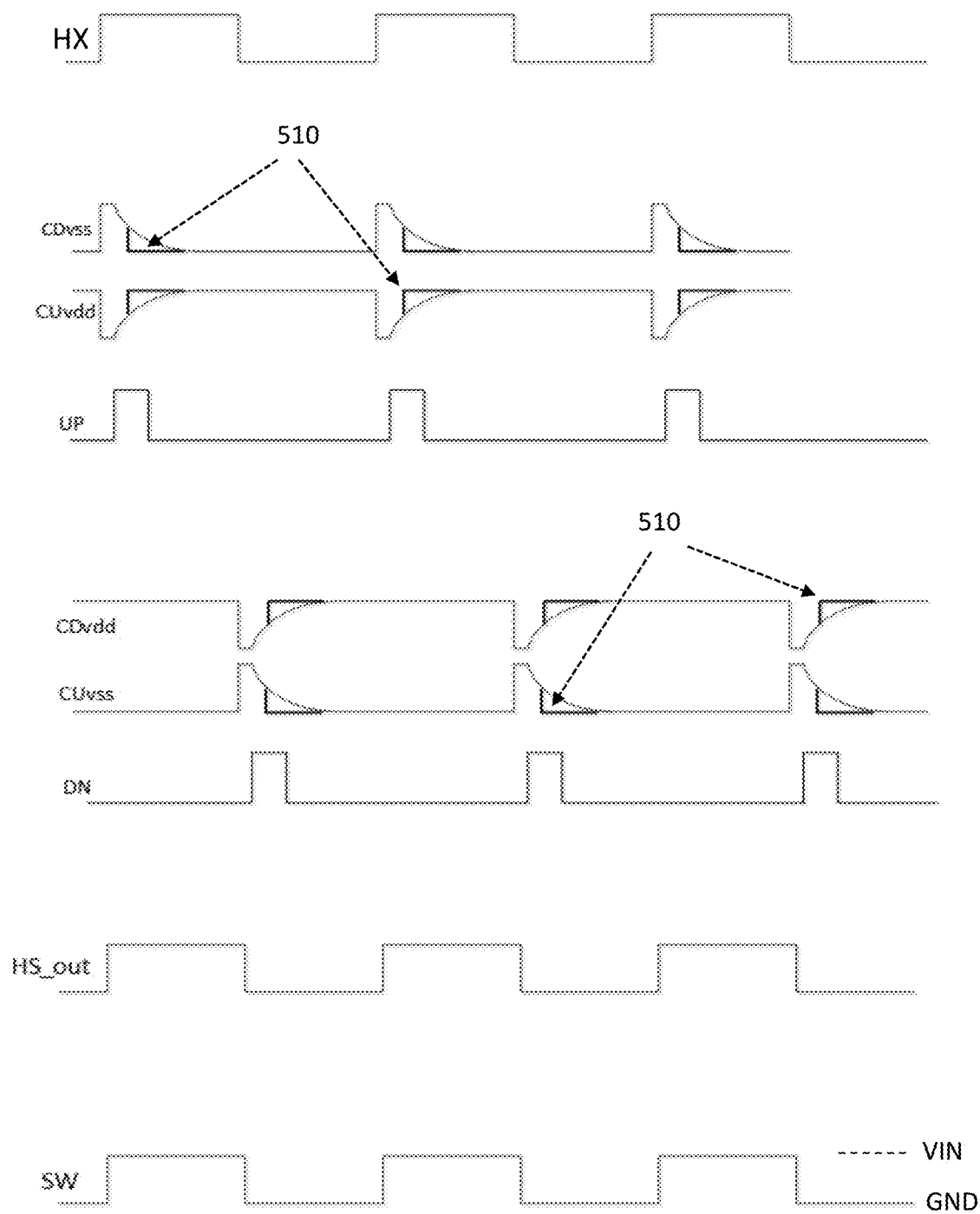
FIG. 7B shows timing diagrams of the two complementary control signals of FIG. 7A.

The HS Level Shifting circuit (325) enables low voltage signals and transistors to control high voltage devices and nodes (e.g. T1, T2, $V_{IN}$). FIGS. 7A-7B and FIG. 8 show auxiliary circuitry that completes the high side control function (e.g. block (355)) in a manner that enables control of the high voltage stacked transistor devices (e.g. DC/DC converter) shown in FIGS. 3A-3B.

FIG. 7A shows logic circuitry, which can be used in the Logic block (330) of the gate driver (310) depicted in FIGS. 3A-3B, that converts the pulsed signals at nodes CUvss, CUvdd, CDvss and CDvdd into square wave logic needed to turn ON and OFF the LS transistor T1 and the HS transistor T2 of the high voltage stacked GaN FETs of FIGS. 3A-3B. Transistor stack (M2, M3) represent a 2-input NAND gate with active low inputs (output is HI if both inputs are LOW), as does transistor stack (M4, M5), which in combination with the inverters M0 and M1 provide the logic to generate a pulse signal at the UP and DN nodes when pulses are present at CUvdd and CDvss or at CUVss and CDvdd.

Transistors M2 and M3 of FIG. 7A pull node labeled UP to HI (e.g. $V_{DD}$) level when CUvdd and inverse of CDvss are both LOW (e.g. at $V_{SS}$ level). Since CDvss is HI when inverse of CDvss is LOW, UP node only goes HI when there is a negative pulse on CUvdd and a positive pulse on CDvss. A rising $V_{SS}$ (e.g. SW) and $V_{DD}$ (e.g. Vdd2+SW) can induce false positive pulses at node CDvss and can have no effect on node CUvdd, and likewise, a falling $V_{SS}$ (e.g. SW) and $V_{DD}$ (e.g. Vdd2+SW) can induce false negative pulses at node CUvdd and can have no effect on node CDvss. Since signal at node UP goes HI only when there is a negative pulse on CUvdd and a positive pulse on CDvss, and since neither a rising nor a falling $V_{SS}$ (e.g. SW) and $V_{DD}$ (e.g. Vdd2+SW) can simultaneously create opposite going pulses at nodes CDvss and CUvdd, false triggers (pulses) at node UP due to rising/falling $V_{SS}$ and $V_{DD}$ are avoided.

With continued reference to FIG. 7A, transistor stack (M4, M5) represents a 2-input NAND gate with active low inputs. M4 and M5 pull node labelled DN to a HI (e.g. $V_{DD}$) level when CDvdd and inverse of CUvss are both LOW. Since M5 gate voltage is low when CUvss is HI, DN node only goes HI when there is a negative pulse on CDvdd and a positive pulse on CUvss. A rising $V_{SS}$ (e.g. SW) and $V_{DD}$ (e.g. Vdd2+SW) can induce false positive pulses at node CUvss and can have no effect on node CDvdd, and likewise, a falling $V_{SS}$ (e.g. SW) and $V_{DD}$ (e.g. Vdd2+SW) can induce false negative pulses at node CDvdd and can have no effect on node CUvss. Since signal at node DN goes HI only when there is a negative pulse on CDvdd and a positive pulse on CUvss, and since neither a rising nor a falling $V_{SS}$ and $V_{DD}$ can simultaneously create opposite going pulses at nodes CDvdd and CUvss, false triggers (pulses) at node DN due to rising/falling $V_{SS}$ and $V_{DD}$ are avoided. This completes the explanation of how the level shifter according to the various embodiments of the present disclosure ensures against false triggers due to rising/falling of $V_{SS}$ and $V_{DD}$. As discussed in the above sections of the present disclosure, a factor contributing to the immunity of the level shifter according to the various embodiments of the present disclosure with respect to possible false triggering due to the shifting nature of the supply and reference voltages ($V_{DD}$ and $V_{SS}$) to the level shifter, is the condition that only two pulses of opposite polarities can trigger an output pulse event at either the UP or the DN nodes.

FIG. 7B shows the timing diagram for the circuitry shown in FIG. 7A. As shown in FIG. 7B, both signals at the UP and DN nodes are square wave signals containing timing information obtained from the input HX signal to initiate turning ON or OFF the high side GaN FET, T2, of FIGS. 3A-3B, respectively.

As can be seen in the timing diagram of FIG. 7B, one edge (rising) of the input signal HX causes CUvdd, which is normally HI, to go LOW, and causes CDvss, which is normally LOW, to go HI, therefore in combination, causing the signal at the UP node to transition from its normally LOW state to a HI state. Similarly, the opposite edge (falling) of the input signal HX causes CDvdd, which is normally HI, to go LOW, and causes CUvss, which is normally LOW, to go HI, therefore in combination, causing the signal at the DN node to transition from its normal LOW state to a HI state. As a result, LOW to HI transitions of signals at the UP and DN nodes represent timing information of the input HX signal respectively associated with rising and falling edges of the input HX signal.

FIG. 8 adds in a final logic block (LOGIC_out), which can be used in the Logic block (330) of the HS level shifter (325) of the gate driver (310) depicted in FIGS. 3A-3B, that converts the timing information at the UP and DN nodes into one ON and OFF signal at the HS_out terminal of the final logic block LOGIC_out. In particular, such LOGIC_out block can convert the timing information in the UP and DN pulses into a signal (HS_out) which has the same duty cycle as the input signal HX, as can be seen in FIG. 7B. This can be achieved, for example, by a simple SR flip-flop logic, as known to the skilled person, which flips state of its output with each input pulse. As can be seen in the timing diagram depicted in FIG. 7B, the rising edge of the HS_out signal output by the LOGIC_out block corresponds to the concurrent detection of pulses (e.g. where active region of the pulses overlap, active region of a positive pulse signal being the region where the signal is in a high state, and active region of a negative pulse signal being the region where the signal is in a low state) of opposite polarities at the CDvss and CUvdd nodes which generate the UP pulse. Similarly, the falling edge of the HS_out signal output by the LOGIC_out block corresponds to the concurrent detection of pulses of opposite polarities at the CDvdd and CUvss nodes which generate the DN signal. The signal at HS_out is a level-shifted in-phase version of the IN signal provided at the input terminal IN of the gate driver circuit (310) of FIGS. 3A-3B (e.g. originated in a PWM not shown, but discussed above) whose timing (e.g. edge to edge distance) and level are intended to control the turning ON and OFF of the high side GaN FET T2. As mentioned in the above sections of the present disclosure, the HS_out signal output by the LOGIC_out block is fed to the HS output driver (355) for conversion to an HS_out (equivalent) signal which contains the exact same timing information but with the drive and amplitude required to drive the high side GaN FET T2 (thereby denoting both signals HS_out). Combination of the HS_out signal with the LS out signal for the low side GaN FET T1 creates the desired ON percentage (e.g. $V_{IN}$ versus GND) at the common node SW. As previously mentioned in the present disclosure, the signal at node SW is the DC/DC converter output node (prior to filtering), pulled up to $V_{IN}$ or pulled down to GND per instructions from the IN signal (e.g. PWM). A person skilled in the art can appreciate that all the signals shown in FIG. 7B have low voltage logic swings (such as being bounded by $V_{SS}$ and $V_{DD}$) except for signal at node SW, which has a HI level of $V_{IN}$ and a LOW level of GND.

Figure 9:
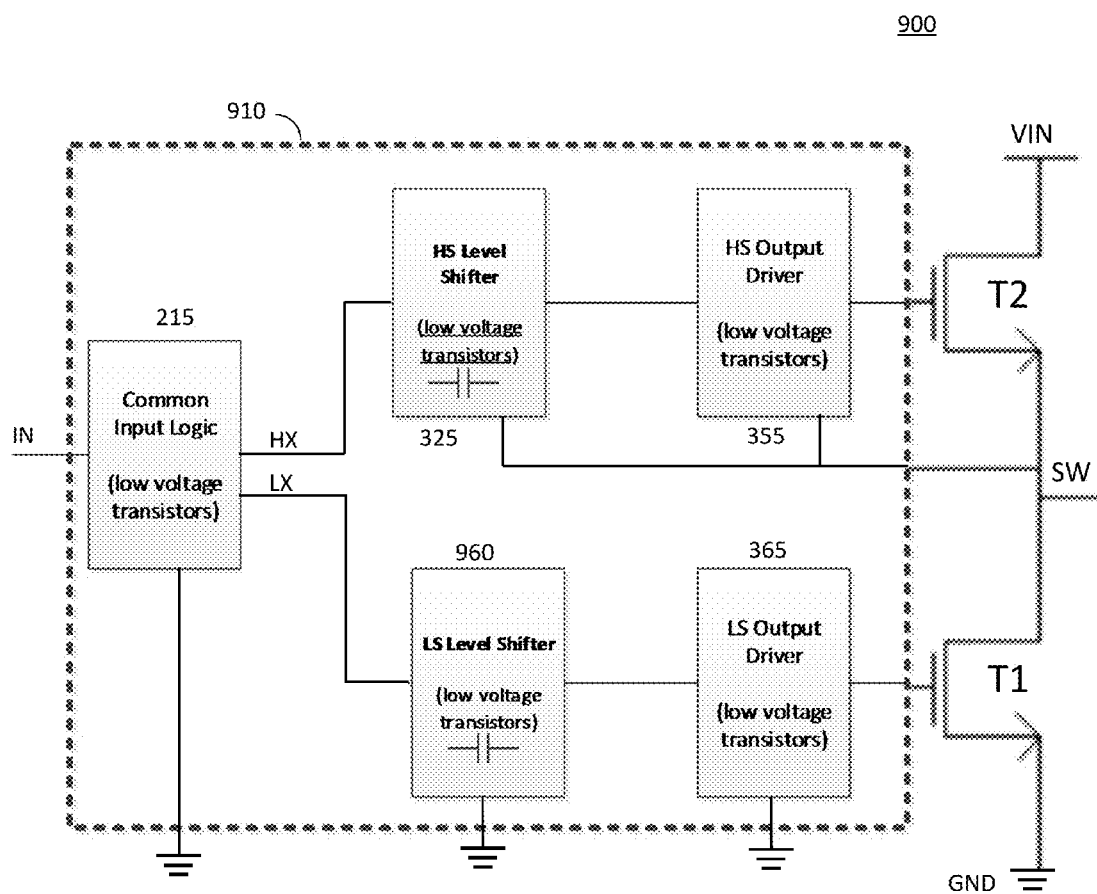
FIG. 9 shows a block diagram of a gate driver circuit according to an embodiment of the present disclosure where two low voltage level shifters similar to the HS level shifter of FIGS. 3A-3B are used, each controlling one transistor of the stack depicted in FIG. 1.

FIG. 9 depicts a further embodiment of a gate driver (910) of the present disclosure which uses a level shifter similar to the HS level shifter (325) according to the various previous embodiments presented above for a low side control path of the low side high voltage transistor T1 (960) and a high side control path of the high side high voltage transistor T2 (325). This exemplary approach according to an embodiment of the present disclosure can ensure that signal paths for a control signal at the input IN terminal of the gate driver (910) to each of the GaN FETs T1 and T2 have equal propagation delays and signal levels (e.g. attenuation). In other words, the high side control path comprising the HS level shifter (325) and the HS output driver (355) has a same propagation delay as the low side control path comprising the LS level shifter (960) and the LS output driver (365), where all circuits (325, 355, 365, 960) use exclusively low (breakdown) voltage transistors. In particular, the low side level shifter (960) can have a same input coupling stage of the input timing signal LX as the input coupling stage of the high side level shifter (325). As mentioned in the above sections of the present disclosure, such input coupling stage can be a non-galvanic coupling, such as, for example, a capacitive coupling (e.g. DC blocking) used for edge detection and DC blocking. The person skilled in the art can appreciate that equalizing delay of the HS and LS paths (e.g. controlling an associated signal delay and attenuation) can help control a dead time or an overlap time between the GaN FETs (e.g. time during which T1 and T2 are ON simultaneously) for an increased performance of the implementation. It is an exemplary embodiment of the current invention to have two level shifter circuits (e.g. 325, 960). Such exemplary implementation should not be construed as limiting the scope of the present teachings, as the person skilled in the art readily realizes other exemplary implementations using one or more such level shifter (325) can be possible.

The person skilled in the art readily realizes that despite careful design and layout of the gate driver (310) and (910) depicted in FIG. 3B and FIG. 9 respectively, difference in propagation delays due, for example, to layout and/or component characteristics can arise between the low side and high side control paths. Furthermore, in some cases a difference in responses (e.g. turn ON to turn OFF, and vice versa) of the GaN FETs T1 and T2 can provide an additional undesired effect.

In some cases it may be desirable to control the difference in propagation delays between the low side control path and high side control path, and/or to compensate for the difference in responses between the GaN FETs T1 and T2. Accordingly, such control/compensation can be provided by a dead time control circuit according to the various embodiments of the present disclosure described below.

The dead time control circuit (dead time controller) according to the present disclosure enables to control a difference in timing between the two control signals HS_out, of the high side control path, and LS_out, of the low side control path. In particular, the dead time controller according to the various embodiments of the present disclosure can control a relative timing (time difference) between the edges of the control signals HS_out and LS_out, such as, for example, between two corresponding edges that turn ON transistors T1 and T2, and two corresponding edges that turn OFF transistors T1 and T2. In some embodiments, such control can be performed independently for each of the two control signals.

In some embodiments it can be desirable to control the low side and high side transistors T1 and T2 so as during operation, a period of time during which both transistors T1 and T2 are effectively ON (overlap time) is reduced. In some preferred embodiments, the overlap time is eliminated and replaced by a dead time. As used herein, dead time refers to a period of time during which the low side transistor T1 and the high side transistor T2 are simultaneously OFF.

By providing a dead time, via a dead time controller according to the present disclosure, shoot through current in a power converter, such as the DC voltage conversion circuit depicted in FIGS. 3A-3B and FIG. 9, can be prevented. Shoot through current reduces the efficiency of the DC converter and can potentially damage the devices (T1, T2) being driven. To be effective, dead time control should occur with small propagation delay, consume relatively low power and small area. Due to system variations over manufacturing, applications and other variables, it is desirable that the dead time control be programmable, either at the factory or in the field.

As mentioned above, and with further reference to FIG. 3B, for the DC voltage conversion circuit (300) to operate in an efficient and reliable manner, it is desirable that the low side transistor T1 and the high side transistor T2 are not on at the same time, or a short circuit can exist between $V_{IN}$ and GND (causing the shoot through current), thereby wasting power and potentially damaging the circuit and the transistor devices T1 and T2. Due to the difference in propagation delay between the low side control path and the high side control path as described above, often caused by layout, manufacturing or other variations, an ON control signal (e.g. an edge of the LS_out) at T1 can arrive before its complementary OFF signal (e.g. an edge of the HS_out) arrives at T2, therefore providing an overlap time during which both transistors T1 and T1 are ON. During the overlap time, both transistors are ON, causing the problems noted above.

Figure 10:
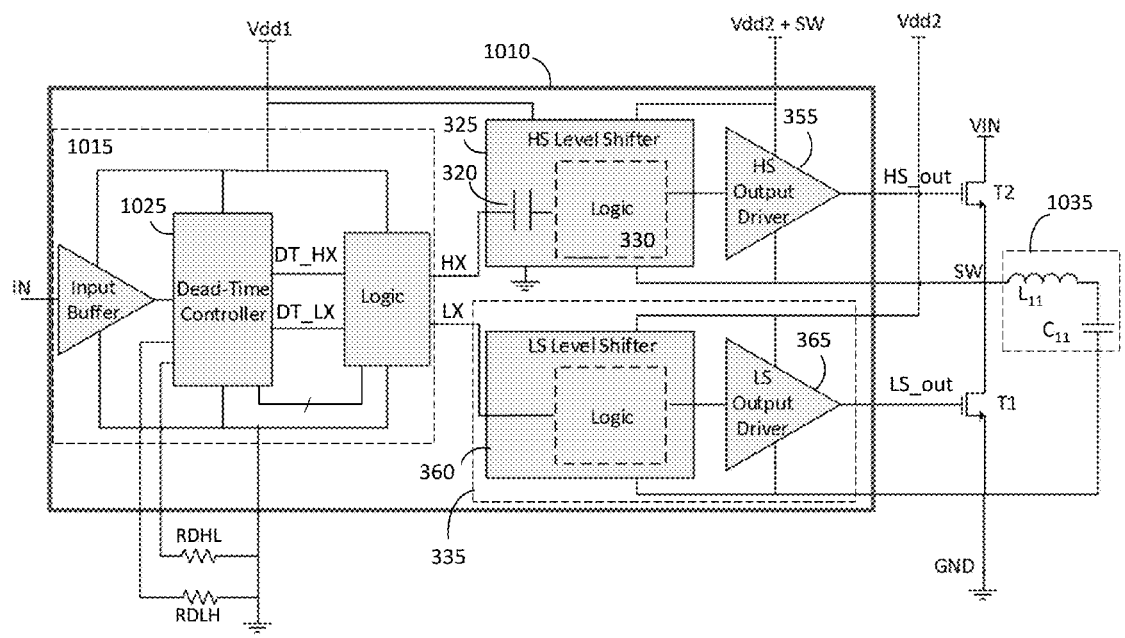
FIG. 10 shows a modified block diagram of the gate driver circuit of FIG. 3B comprising a dead time controller according to an embodiment of the present disclosure.

FIG. 10 shows a modified version of the block diagram of the gate driver circuit (310) of FIG. 3B. In particular, the gate driver circuit (1010) of FIG. 10 according to the present disclosure is fitted with a dead time controller (1025) to provide a dead time control as discussed above. It should be noted that common blocks in the circuits (310) and (1010) of FIG. 3B and FIG. 10, identified by same labels and/or reference designators, perform same functionalities in the respective circuits.

As can be seen in FIG. 10, the dead time controller (1025) is part of a common input logic block (1015) which operates between the low voltage supply Vdd1 and the reference potential GND, similarly to block (315) of FIG. 3B discussed above. Therefore, the dead time controller (1025) according to the various embodiments of the present disclosure comprises low voltage transistors operating within their breakdown voltages. Similarly to the common input logic block (315) of FIG. 3B described above, capacitive coupling (e.g. as provided by the DC blocking edge detection circuit 320) is used for edge detection, and provides DC blocking between the HS level shifter (325) of FIG. 10 and the common input logic block (1015) while providing relevant control timing information associated to the input signal IN to the HS level shifter (325), where the timing information associated to the input signal is further adjusted by the dead time controller (1025).

According to one exemplary embodiment of the present disclosure and as described below, adjustment of the dead time controller can be provided by resistors $RD_{HL}$ and $RD_{LH}$ depicted in FIG. 10. A filter (1035) at the common output node SW of the two transistors T1 and T2 can be used to provide a DC voltage based on a duty cycle of the signal at SW. According to an exemplary embodiment, the filter (1035) can comprise a series inductor ($L_{11}$) and a shunted capacitor ($C_{11}$) to realize a low pass filter at a desired cut off frequency. According to some embodiments of the present disclosure one of, or both, of the capacitor and the inductor can be variable, such as to provide a different inductance/capacitance based on a control signal (data line) to the variable capacitor/inductor. Digitally tunable capacitors (DTCs) and digitally tunable inductors (DTLs) are some exemplary cases of such variable components. More information on DTCs and DTLs can be found, for example, in PCT publication number WO2009/108391 entitled "Method and Apparatus for use in Digitally Tuning a Capacitor in an Integrated Circuit Device", published on Sep. 3, 2009, and in U.S. patent application Ser. No. 13/595,893, entitled "Methods and Apparatuses for Use in Tuning Reactance in a Circuit Device", filed on Aug. 27, 2012, the disclosures of which are incorporated herein by reference in their entirety.

Figure 11:
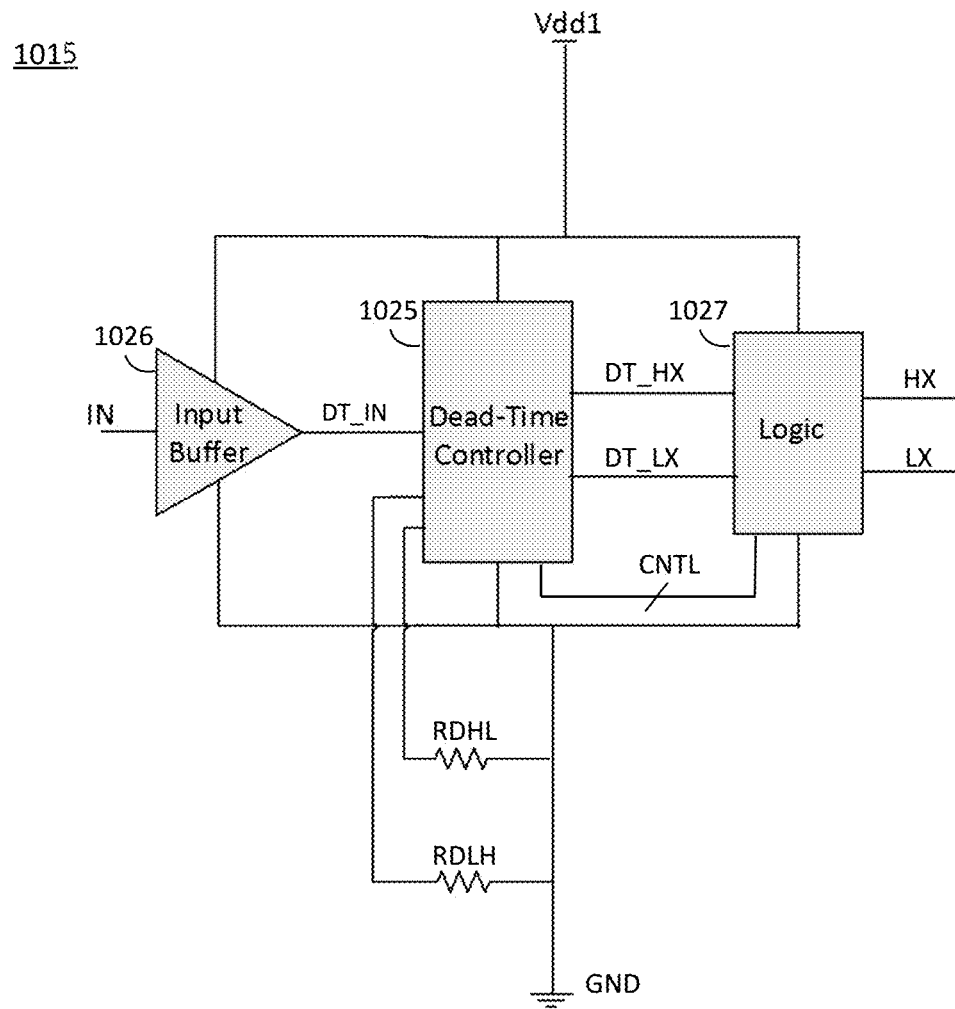
FIG. 11 shows an input block of the gate driver depicted in FIG. 10.

FIG. 11 shows more details of the common input logic block (1015) comprising the dead time controller (1025) placed between the input buffer (1026) and the logic block (1027). Input signal IN is provided to the input buffer (1026) which provides a buffered version of the input signal, DT_IN, to the dead time controller (1025) for dead time adjustment. In turn, the dead time controller (1025) adjusts the edges of the DT_IN signal to provide a low side dead time adjusted signal DT_LX and a high side dead time adjusted signal DT_HX, based on the resistance value of resistors $RD_{HL}$ and $RD_{LH}$. The dead time adjusted signal are then fed to the logic block (1027) which generates signal LX, corresponding to the signal DT_LX, to provide timing control of the low side transistor T1, and signal HX, corresponding to the signal DT_HX, to provide timing control of the high side transistor T2. Various functions of the logic block (1027) are controlled via control signals CNTL provided to the logic block (1027). According to an exemplary embodiment of the present disclosure, under control of the control signals CNTL, the logic block (1027) passes or blocks the DT_LX and DT_HX signals generated by the dead time controller (1025) to/from a next stage of the processing blocks of the gate driver circuit (1010) depicted in FIG. 10. The person skilled in the art will realize that other logic functions and corresponding signals may be required for other system level operations of the gate driver circuit (1010) which for the sake of clarity in the functional description of the dead time controller are not shown in FIGS. 10 and 11.

As seen in FIGS. 10 and 11, and according to some embodiments of the present disclosure, the dead time control circuit (1025) produces a differential output with the desired dead time based on the single ended input signal, DT_IN. According to the exemplary embodiment depicted in FIGS. 10 and 11, the dead time controller (1025) can use two external resistors, $RD_{LH}$ and $RD_{HL}$. These resistors set the desired dead time, as will be described below. The $RD_{HL}$ resistor sets the dead time when the HS_out signal transitions to a low state (from a high state) and the LS_out signal transitions to a high state (from a low state), whereas $RD_{LH}$ sets the dead-time when the LS_out signal transitions to a low state and the HS_out signal transitions to a high state. By reading the following paragraphs of the present disclosure it would become clear to the person skilled in the art that usage of resistors $RD_{LH}$ and $RD_{HL}$ is merely one exemplary embodiment of providing edge adjustments for the purpose of the dead time control, and such exemplary embodiment should not be construed as limiting the scope of what the inventors consider to be their invention.

As discussed above, since $V_{IN}$ can be a large voltage, e.g. 10-100V and higher, and an ON resistance $R_{ON}$ of each of the GaN FETs (T1, T2) is low, e.g. <1Ω, in order not to damage transistors T1 and T2, it is desirable that such transistors not be ON (conducting) at the same time, or equivalently, that HS_out and LS_out signals not be high at the same time, as shown in FIG. 12A, assuming that both transistors T1 and T2 turn ON at the high level of the control signals HS_out and LS_out. Having both transistors, T1 and T2, ON at the same time, leads to very large shoot-through currents in the transistors. This can have the undesired effect of dramatically reducing the efficiency of the circuit (1000) and potentially damage T1 and T2. As noted above, careful control of the timing (e.g. relative edge positions) of LS_out and HS_out signals can prevent such undesired effect.

FIG. 12A shows the timing relationship between the high side control signal, HS_out, and the low side control signal, LS_out. As discussed earlier, such timing can be adjusted by the dead time control circuit according to the present disclosure. As can be seen in FIG. 12A, signal HS_out is high during a time interval $T2_{ON}$, corresponding to an ON state of the high side transistor T2, and low during a time interval $T2_{OFF}$, corresponding to an OFF state of the high side transistor T2. Similarly, signal LS_out is high during a time interval $T1_{ON}$, corresponding to an ON state of the low side transistor T1, and low during a time interval $T1_{OFF}$, corresponding to an OFF state of the low side transistor T1.

With further reference to the timing relationship of FIG. 12A, one can see that time intervals $T2_{ON}$ and $T1_{ON}$ are separated by non-zero time intervals $t_{DLH}$ and $t_{DHL}$. Such non-zero time intervals, each define a positive dead time between the timing controls of the high side and the low side transistors T2 and T1. That is, assuming that both transistors T1 and T2 have a same turn ON time and a same turn OFF time, their ON states will not overlap, similar to the timing diagram of the associated control signals depicted in FIG. 12A. It should be noted that the dead time controller according to the present disclosure can generate positive and negative (described below) dead times, where the time intervals $t_{DLH}$ and $t_{DHL}$ are not necessarily of a same value.

FIG. 12B shows the timing relationship between the high side control signal, HS_out, and the low side control signal, LS_out, for a positive dead time (i.e, $t_{DLH}$ and $t_{DHL}$ are both positive). According to a convention of the present disclosure, a positive dead time is defined by a positive time interval $t_{DLH}$ and/or a positive time interval $t_{DHL}$, where such time intervals are measured as the difference in timing position of a turn-ON transition (e.g. at times $t_2$, $t_4$) of a control signal and a turn-OFF transition (e.g. at times $t_1$ and $t_3$) of the alternate control signal. Accordingly, $t_{DHL}$ is the time interval between the rising transition of the low side control signal LS_out (at time $t_4$) and the falling transition of the high side control signal HS_out (at time $t_3$), therefore $t_{DHL}=(t_4-t_3)$. Similarly, $t_{DLH}$ is the time interval between the rising transition of the high side control signal HS_out (at time t2) and the falling transition of the low side control signal LS_out (at time $t_1$), therefore $t_{DLH}=(t_2-t_1)$.

Using the above convention, the timing diagram of FIG. 12B shows positive dead time for both the high side and the low side paths, whereas the timing diagram of FIG. 12C shows negative dead time for both paths. As stated above, positive dead time at LS_out (LS_out rising transition comes after HS_out falling transition) and HS_out (HS_out rising transition comes after LS_out falling transition) can be a preferred condition for operating the high voltage transistors T1 and T2. In some cases where, for example, the high side and low side paths have a fix delay skew between them, or the transistors T1 and T2 have different characteristics, it may be desirable to provide a negative dead time at one of, or both, of the LS_out and HS_out signals. Accordingly, the dead time controller according to the present disclosure enables both positive and negative dead times. Since the primary usage is typically with a positive dead time, unless otherwise stated, the descriptions below should be understood to be for positive dead time.

To clarify the basic operation of the dead time controller of the present disclosure, it is assumed that the low side and high side paths have equal propagation delays, which means the dead time between the DT_HX and DT_LX signals depicted in FIG. 10 (and FIG. 11) equals the dead time between the HS_out and LS_out signals depicted in FIG. 10. For the case of unequal propagation delays between the high side and the low side paths, the adjusting function of the dead time control circuit of the present disclosure will be understood by a person skilled in the art who will recognize that resistor values $RD_{HL}$ and $RD_{LH}$ will require adjustment to accommodate the difference.

Figure 13:
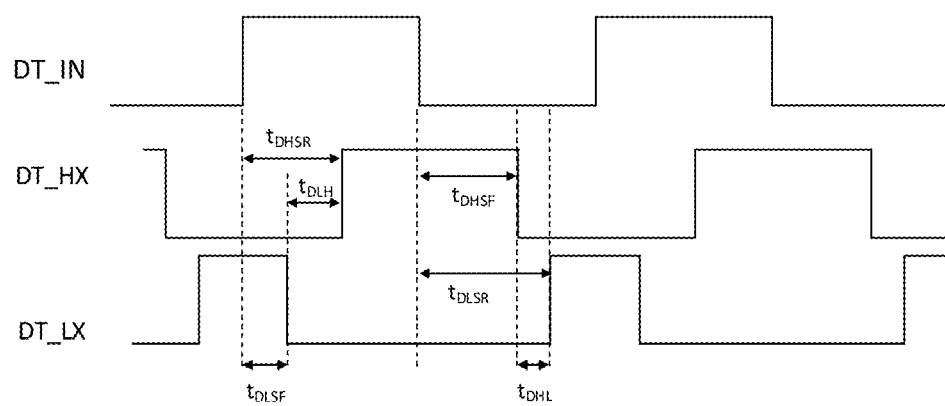
FIG. 13 shows exemplary relative timing of control signals generated by the dead time controller circuit of the present disclosure.

As described above, the DC output of the overall circuit of FIG. 10 obtained after filtering by the low pass filter (1035), comprising $L_{11}$ and $C_{11}$, is proportional to the duty cycle at the common output node SW, hence the duty cycle of the high side dead time adjusted signal DT_HX is essentially equal to the duty cycle of the input signal IN (thus of DT_IN). For the high side signal DT_HX to have the same duty cycle of the input signal IN, the time intervals $t_{DHSR}$ and $t_{DHSF}$, as defined below in FIG. 13, are essentially equal. Again, to simplify the basic description of the circuit while maintaining the desired DC output voltage, and therefore a corresponding desired duty cycle at the common output node SW, dead time adjustments will be confined to the low side circuitry, while the high side circuitry will be set to follow the desired duty cycle. In other words, under control of the dead time controller (1025) of the gate driver circuit (1010), the high side transistor T2 is ON for a same time duration ($T2_{ON}$ of FIG. 12A later described) as an ON time of an output of a pulse width modulator representing the average ON/OFF ratio of the signal at the common output node SW represented by the input signal IN to the gate drive circuit (1010).

FIG. 13 shows the relative timing of the dead time controller signals according to an embodiment of the present disclosure. These signals include the input signal to the dead time controller, DT_IN, its high side output signal, DT_HX, and its low side output signal, DT_LX. As stated above, to ensure the proper output DC voltage, the duty cycle, as set by the ON duration of the HS transistor T2, should equal the duty cycle of DT_IN. The timing diagram of the dead time controller depicted in FIG. 13 ensures that both transistors are not ON at the same time while providing a desired DC output voltage defined by the duty cycle of the input signal, IN, and therefore of the input signal to the dead time controller, DT_IN.

As shown in the timing diagram depicted in FIG. 13, the rising edge of DT_LX is delayed, with respect to the falling edge of DT_HX, by a time interval of length $t_{DHL}$, while the falling edge of DT_LX is advanced, with respect to the rising edge of DT_HX, by a time interval of length $t_{DLH}$. This ensures a desired operation where no overlap between an ON state of the HS control signal and an ON state of the LS control signal exist. Such desired operation in the exemplary embodiment depicted by the associated timing diagram of FIG. 13 provides positive dead times ($t_{DHL}$, $t_{DLH}$) at both transitions of the high side control signal. As mentioned above, there may be a desire to create a negative dead time, in which case a person skilled in the art will recognize that the rising and falling edges would be adjusted in opposite directions to those described for the positive dead time control described herein and with reference to FIG. 13.

Having described the overall function of dead time controller according to some embodiments of the present disclosure, an exemplary embodiment is now described in detail. A person skilled in the art will recognize that other embodiments and variations thereof are possible to provide the functionality of the dead time controller according to the present disclosure, and the following exemplary embodiment should not be considered as limiting what the inventors considers to be their invention.

Figure 14:
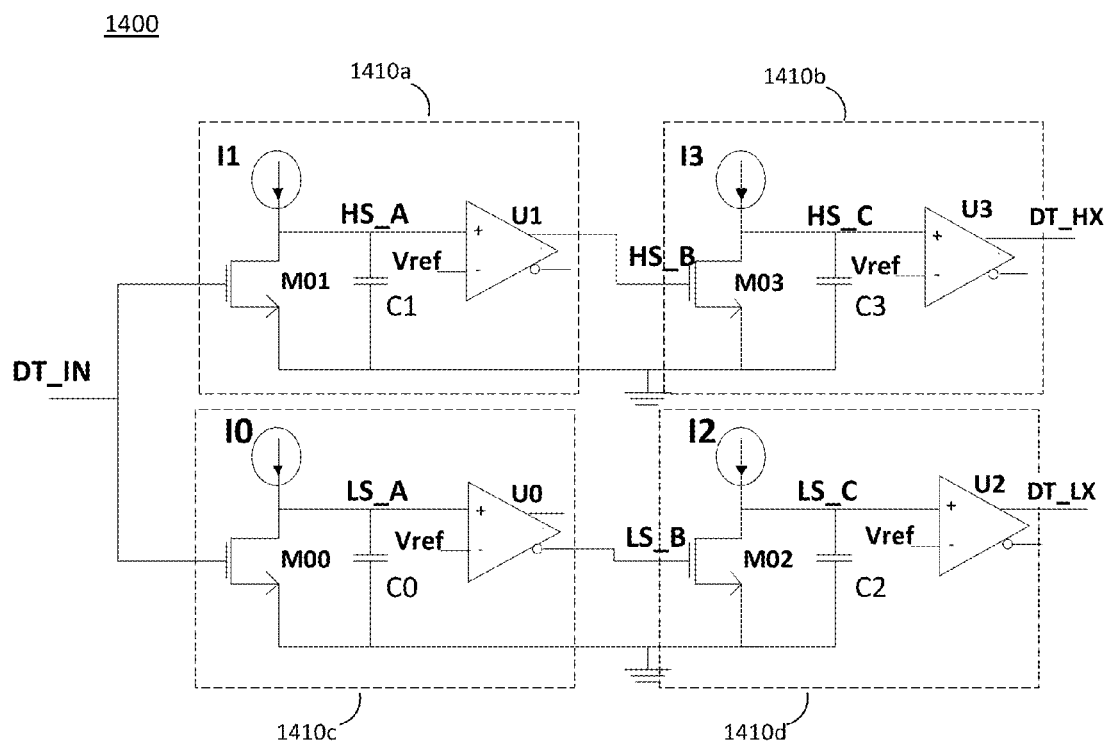
FIG. 14 shows an exemplary circuital representation of the dead time controller of the present disclosure.

An exemplary circuital representation (1400) of the dead time controller (1025 of FIGS. 10-11) according the present disclosure is shown in FIG. 14. The dead time control circuit (1400) comprises two similar parallel processing paths, each for processing a same input signal DT_IN to generate one of the high side and the low side timing control signal. A timing diagram of signals at various points HS_A, HS_B, HS_C of the high side processing path, as indicated in FIG. 14, is provided in FIG. 15A. Similarly, a timing diagram of signals at various points LS_A, LS_B, LS_C of the low side processing path, as indicated in FIG. 14, is provided in FIG. 15B. As can be seen in FIG. 14, the exemplary dead time control circuit (1400) comprises a basic processing circuit (1410a-1410d) which comprises a current source (I0-I3), a transistor (M00-M03), a capacitor (C0-C3), and a comparator (U0-U3). Each of the two processing paths comprises two such basic processing circuits cascaded; the high side processing path comprises basic processing circuits (1410a, 1410b), and the low side processing path comprises basic processing circuits (1410c, 1410d).

With continued reference to FIG. 14, the first basic processing circuit (1410a) of the high side processing path takes the input signal DT_IN as input, via its input transistor M01, and feeds a non-inverting output of the associated comparator U1 to the input transistor M03 of the cascaded second basic processing unit (1410b). In turn, the second basic processing unit (1410b) processes its input to generate the high side dead time adjusted control signal DT_HX, obtained at the non-inverting output of the associated comparator U3. In a similar fashion, the first basic processing circuit (1410c) of the low side processing path takes the input signal DT_IN as input, via its input transistor M00, and feeds an inverting output of the associated comparator U0 to the input transistor M02 of the cascaded second basic processing unit (1410d). In turn, the second basic processing unit (1410d) processes its input to generate the low side dead time adjusted control signal DT_LX, obtained at the non-inverting output of the associated comparator U2.

By describing the function of the basic processing circuit (1410c) provided by I0, M00, C0 and U0, a person skilled in the art will recognize that each of the other similar combinations (1410a-1410c) functions in the same manner.

The person skilled in the art will also recognize that magnitude of currents associated to the current sources (I0-I3) could be set internally or externally, with respect to an integrated circuit comprising the dead time controller, through resistors (or other means) such as (external) resistors RDHL and RDLH shown in FIGS. 10-11. The basic description, immediately following, also ignores comparator delays which will be discussed subsequently.

With reference to the basic processing circuit (1410*c*) of FIG. 14, current source I0 forces a current that can only flow through the transistor M00 or capacitor C0 since the non-inverting input to comparator U0, which is connected to the common node LS_A of transistor M00 and current source I0, is a high impedance input that cannot sink the current I0.

Figure 15A:
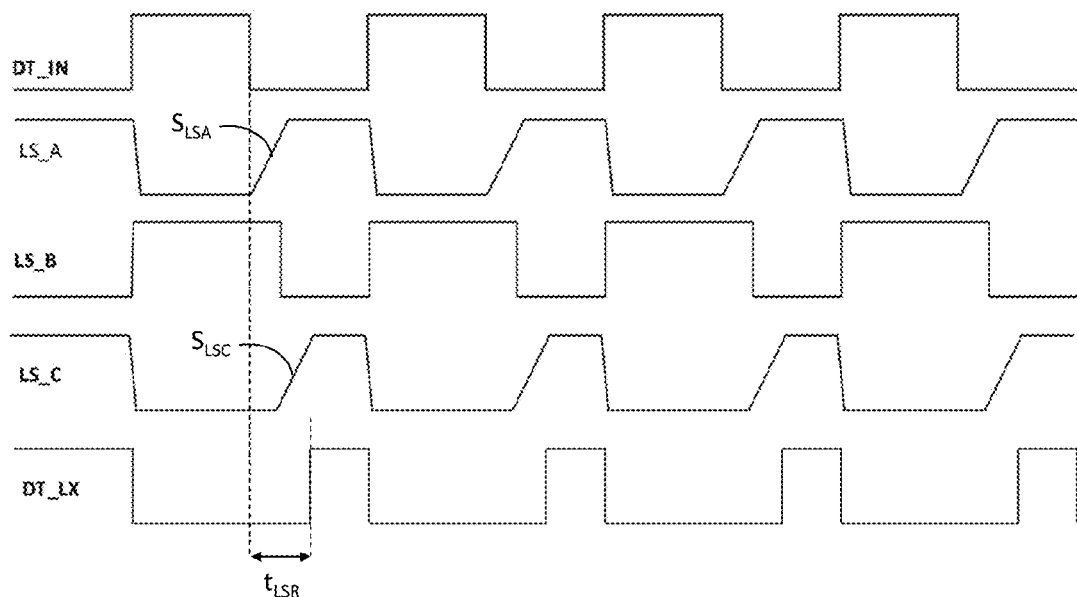
FIG. 15A shows timing diagrams associated to nodes of a low side signal processing path of the dead time controller circuit represented in FIG. 14.

When the input signal DT_IN to the circuit (1410*c*) is in a high state, transistor M00 is in an ON state (conducting), pulling down node LS_A while current from the current source I0 flows to ground through the conducting transistor M00, thereby bypassing capacitor C0. Conversely, when input signal DT_IN to the circuit (1410*c*) is in a low state, transistor M00 is in an OFF state (non-conducting), and current from the current source I0 flows through the capacitor C0, thereby charging the capacitor C0 with a constant current and pulling node LS_A high. A person skilled in the art will recognize that charging the capacitor C0 with a constant current (from the constant current source I0),will generate a voltage rise across the capacitor C0, and therefore at node LS_A, in a linear fashion, as shown in FIG. 15A for node LS_A. As can be seen in FIG. 15A, the slope $S_{LSA}$ associated to the low to high transition of the LS_A node is of (substantially) constant value.

With further reference to the basic processing circuit (1410*c*) of FIG. 14 and the associated timing diagram of FIG. 15A, node LS_A drives one input (e.g. non-inverting) of the comparator U0 while the other input (inverting) of the comparator U0 is connected to a reference voltage Vref. When the voltage at node LS_A reaches the level of the reference voltage Vref, the inverting output node of the comparator U0, denoted LS_B in FIG. 14, switches state. As shown in FIG. 15A, such switching at the node LS_B occurs at a time, delayed with respect to the trailing edge of the input signal DT_IN, which is determined by the slope $S_{LSA}$ of the voltage rise at LS_A (which is set by C0/I0) and the voltage Vref. Therefore, the signal at node LS_B is created via two logic inversions (through transistor M00 and comparator U0) of the DT_IN input signal and a delayed trailing edge with respect to the trailing edge of the DT_IN signal. As can be seen in FIG. 15A, the signal at node LS_B has a same polarity as the input signal DT_IN and has its trailing edge delayed with respect to the trailing edge of DT_IN by an amount determined by the slope $S_{LSA}$ of the signal at node LS_A (and Vref, not shown in FIG. 15A).

Continuing through the low side signal path of the exemplary dead time controller (1400), a similar process repeats itself with I2, M02 and C2 of the basic processing circuit (1410*d*), with the difference that the non-inverting output of the comparator U2 is used to provide the output DT_LX which therefore has an inverted polarity with respect to its input signal (at node LS_B, and therefore has an inverted polarity with respect to DT_IN). There are three logical inversions in the low side processing path of the input signal DT_IN, one each at transistor M00, comparator U0 and transistor M02, resulting in a net inversion of the signal DT_LX as compared to DT_IN. As can be seen in FIG. 15A for node DT_LX, the proper time delay, with respect to DT_IN, is added to the leading edge of DT_LX. In the low side path, comparator U0 is inverting. Current source I0 delays the falling edge of DT_IN, which becomes the falling edge of LS_B. Then, the current source I2 delays the falling edge of LS_B, via slope SLSC at node LS_C, which becomes the rising edge of DT_LX. In the low side processing path the rising edge of DT_IN is not delayed and becomes the falling edge of DT_LX since DT_IN gets inverted, as can be seen in FIG. 15A.

Figure 15B:
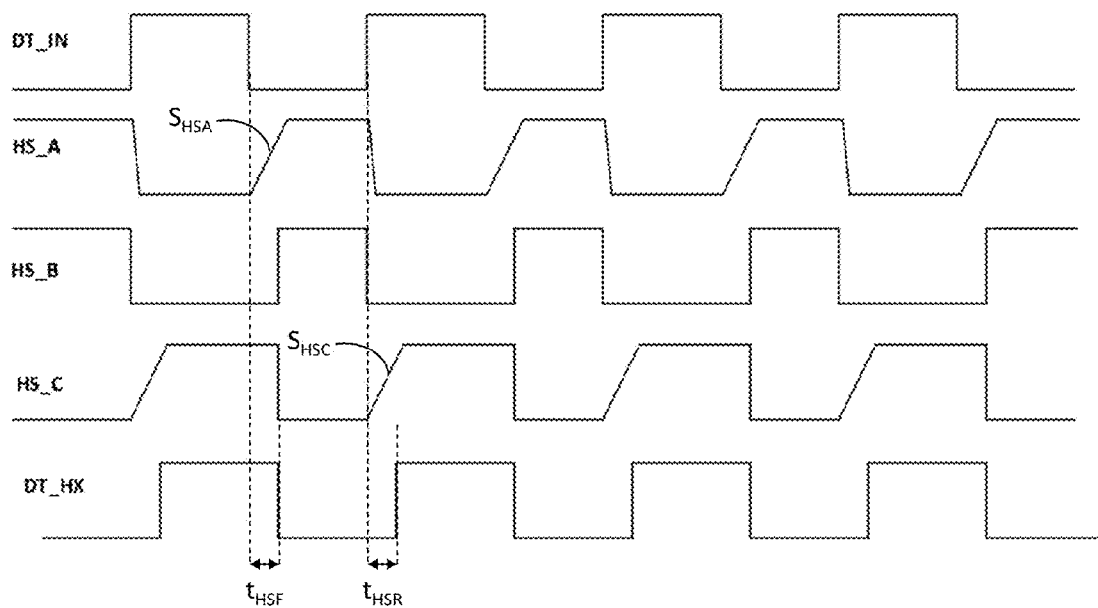
FIG. 15B shows timing diagrams associated to nodes of a high side signal processing path of the dead time controller circuit represented in FIG. 14.

Functionality of the high side processing path (1410*a*, 1410*b*) of the exemplary dead time control circuit represented in FIG. 14 is substantially the same as the functionality of the low side processing path (1410*c*, 1410*d*) described above. However, comparator U1 used in the high side processing path is non-inverting so that signals DT_IN and HS_B are out of phase, meaning that circuit (1410*a*) and circuit (1410*b*) delay opposite edges of the input signal DT_IN via slopes $S_{HSA}$ and SHSC at nodes HS_A and HS_C respectively (see FIG. 15B). That is, as can be seen in FIG. 15B, the basic processing circuit (1410*a*) via its circuit elements (I1, M01, C1) causes time delay on the trailing edge of the input signal DT_IN at node HS_A through slope $S_{HSA}$, while the basic processing circuit (1014*b*) via its circuit elements (I3, M03, C3) causes time delay on the leading edge of the input signal DT_IN at node HS_C through slope $S_{HSC}$. As can be seen in the timing diagram of FIG. 15B, assuming that constant current sources I1 and I3 output a same magnitude current, and capacitance value of capacitors C1 and C3 are equal, both leading and trailing edges of the DT_IN signal are delayed by an equal amount, resulting in a same pulse width for signals DT_HX and DT_IN, while shifting the pulse corresponding to the DT_IN signal by a delay set by I1, C1 and Vref at DT_HX. According to some embodiments of the present disclosure, maintaining pulse width of the high side driver (e.g. HS_out) is required for proper function of the DC voltage converter depicted in FIG. 10.

In the exemplary embodiment of the dead time controller circuit according to the present disclosure depicted in FIG. 14, two delay circuits per each side, (1410*a*, 1410*b*) for the high side and (1410*c*, 1410*d*) for the low side, are used so that the duty cycle can be maintained on the high side while the duty cycle is adjusted on the low side, thereby creating a positive dead time which ensures that both DT_HX and DT_LX signals are not high simultaneously (do not overlap).

As known to a person skilled in the art, the comparators U1-U3 used in the exemplary dead time controller (1400) of FIG. 14 can introduce a relatively large propagation delay when used in the gate driver circuit (1010). In order to reduce the overall propagation delay of the gate driver circuit (1010), it can be desirable to replace such comparators with alternative elements with lower propagation delays. It follows that according to a further embodiment of the present disclosure, such propagation delay is reduced by using inverters instead of the comparators, as shown in FIG. 16.

Figure 16:
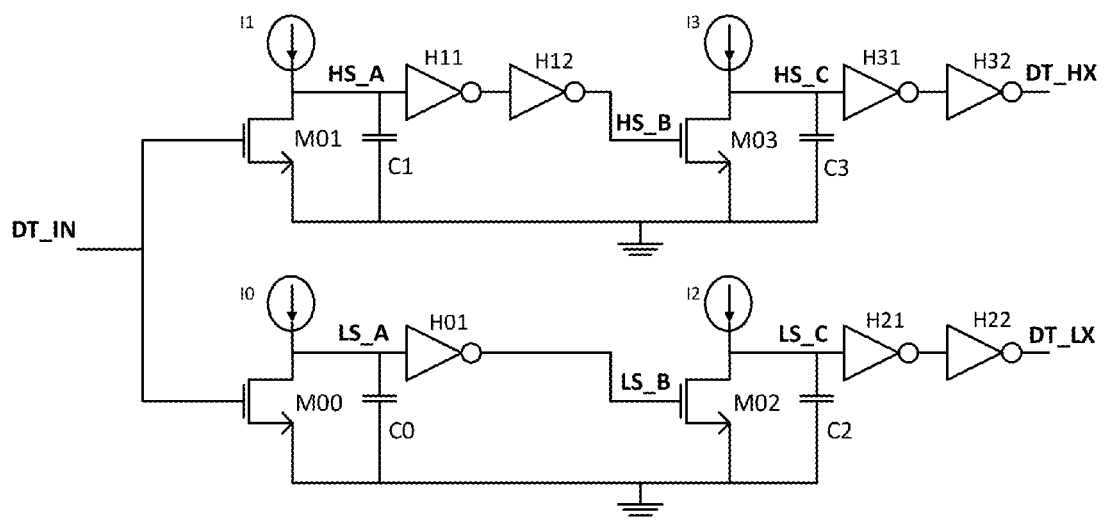
FIG. 16 shows an exemplary circuital representation of the dead time controller of the present disclosure with a reduced propagation delay.

FIG. 16 shows an exemplary dead time controller circuit (1600) according to an embodiment of the present disclosure based on the circuit (1400) of FIG. 14, where the comparators U0-U3 are replaced with inverters (H01-H32), thus improving the propagation delay of the dead time controller circuit. As can be seen in FIG. 16, a non-inverting comparator of FIG. 14 is replaced with two cascaded inverters, and an inverting comparator of FIG. 14 is replaced with a single inverter. For example, non-inverting comparator U1 is replaced with cascaded inverters (H11, H12), non-inverting comparator U3 is replaced with cascaded inverters (H31, H32), non-inverting comparator U2 is replaced with cascaded inverters (H21, H22), and inverting comparator U0 is replaced with single inverter H01.

As known to a person skilled in the art, a trip point associated with an inverter, the inverter trip point, can change with a process (P) used to fabricate the inverter, as well as with a voltage (V) applied to the inverter (e.g. biasing, supply) and an operating temperature (T) of the inverter. Such "PVT" characteristics of the inverter can therefore affect operation of the exemplary dead time controller circuit represented in FIG. 16. It follows that according to an embodiment of the present disclosure, the current sources (I0-I3) have output currents which are proportional to the trip point of the inverters (H01-H32). It can be assumed that given a same fabrication process of such inverters, corresponding trip points remain the same as a function of the PVT, since such inverters see a same bias/supply voltage (e.g. Vdd1) and are placed in a very close physical proximity of each other and therefore subjected to a same local temperature.

Figure 17A:
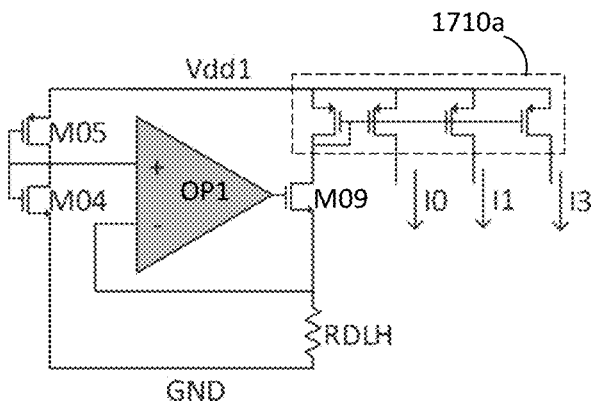
FIGS. 17A-17B show current source circuits with compensated current with respect to process, voltage and temperature variations.
Figure 17B:
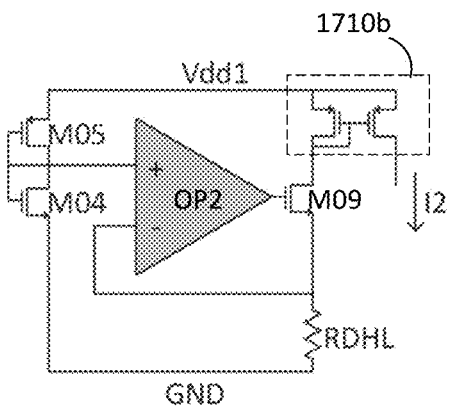

FIGS. 17A and 17B show current source circuits 1700A and 1700B according to further embodiments of the present disclosure which can provide currents to the dead time controller circuit (1600) which are compensated with respect to the PVT that causes a drift of the trip point of the inverter circuits (H01-H32).

In FIG. 17A, an exemplary circuit is shown that ensures that the current sources (I0, I1, I3) are proportional to the inverter trip point, causing the impact of a variable trip point on time delay, as described above, to be cancelled by the proportionally adjusted amount of current in current sources (I0, I1, I3). The exemplary circuit represented in FIG. 17A achieves this by using a current mirror circuit (1710A) (comprising a reference current leg series connected with transistor M09, and one or more output mirrored legs I0, I1, I3) which mirrors a current going through the transistor M09 and the resistor RDLH. A person skilled in the art will realize that such current is equal to Vtrip of the inverter formed by M04 and M05 divided by the external resistor RDLH. As the inverter (M04, M05) is representative of the inverters (H01-H32) used in the exemplary dead time controller (1600), its trip point varies similarly to (tracks) the trip point of inverters (H01-H32).

More specifically, it is commonly known that the biased inverter shown in FIG. 17A formed by M04 and M05 and connecting the common drain node of the transistors to the common gate node of the transistors, operates at its trip point (as inverter is biased at or close to its trip point voltage), latter trip point voltage being proportional to PVT as described above. This voltage serves as a reference voltage for the operational amplifier OP1 which takes its driven voltage from the voltage on the external resistor, RDHL. Due to this feedback, the operational amplifier OP1 forces the voltage on the external resistor RDLH to track the inverter (M4, M5) trip point voltage, and thereby forces the current through the external resistor to track the PVT. The known current mirror (1710a) depicted in FIG. 17A forces each of the currents (I0, I1,I3) to match the current through the resistor RDLH and thereby forces currents (I0, I1, I3) to track the PVT. FIG. 17B shows a similar circuit to the circuit of FIG. 17A, where a PVT-compensated current I2 is generated using a reference resistor RDHL, an operational amplifier OP2, a current mirror (1710b) and an inverter (M04, M05). The circuit in FIG. 17B operates in a same manner as the circuit of FIG. 17A described above.

It should be noted that while the exemplary circuits depicted in FIG. 17A and 17B show two values for RDLH and RDHL, which are responsible for setting magnitude of currents for the four current sources (I0, I1, I2, I3), it is possible to use more than 2 (e.g. 3 or 4) different resistors to set the magnitude of currents of the four current sources, as desired, where such current sources, in combination with the corresponding charging capacitors, define dead times of the dead time controller circuit (1600) depicted in FIG. 16.

The person skilled in the art readily understands that the various teachings of the present disclosure can apply to multiple semiconductor materials and device structures. For simplicity, the embodiments and examples presented herein for illustrative purposes include only GaN FETs as the high voltage devices controlled by the gate driver circuit (e.g. HS level shifter) according to the various embodiments of the present disclosure, and SOI MOSFETs for the low voltage control devices used in the gate driver circuit (e.g. HS level shifter). The person skilled in the art can use the teachings according to the various embodiments of the present disclosure to derive level shifters and controls using other types of low voltage transistors (e.g. non SOI MOSFETs) and for interfacing with other types of high voltage transistors (e.g. non GaN FETs).

As mentioned in the prior sections of the present disclosure, the Level Shifter (e.g. HS level shifter (325)) according to the various presented embodiments, as well as the gate driver circuit (310, 910), can be manufactured, either in its entirety or partially, in an integrated circuit based on various technologies, and in particular in CMOS or SOI CMOS. Again, as mentioned above, CMOS technologies, whether bulk Si or SOI, have high level of integration, ease of manufacturing and an associated low cost. Furthermore and as previously noted, low voltage (e.g. standard CMOS) transistors can have speed and performance which can drive GaN circuits (e.g. comprising high voltage GaN FET transistors) in a manner that benefits from the low FOM of GaN transistors.

However, while no transistor in the current level shifter (e.g. HS level shifter (325) withstands a high voltage across the transistor (e.g. across its drain and source), the overall circuit as described above (e.g. level shifter) floats to high voltage (e.g. with voltage at node SW) and therefore the entire circuit is isolated from GND and withstands the high voltage drop from $V_{IN}$ to GND.

Figure 18A:
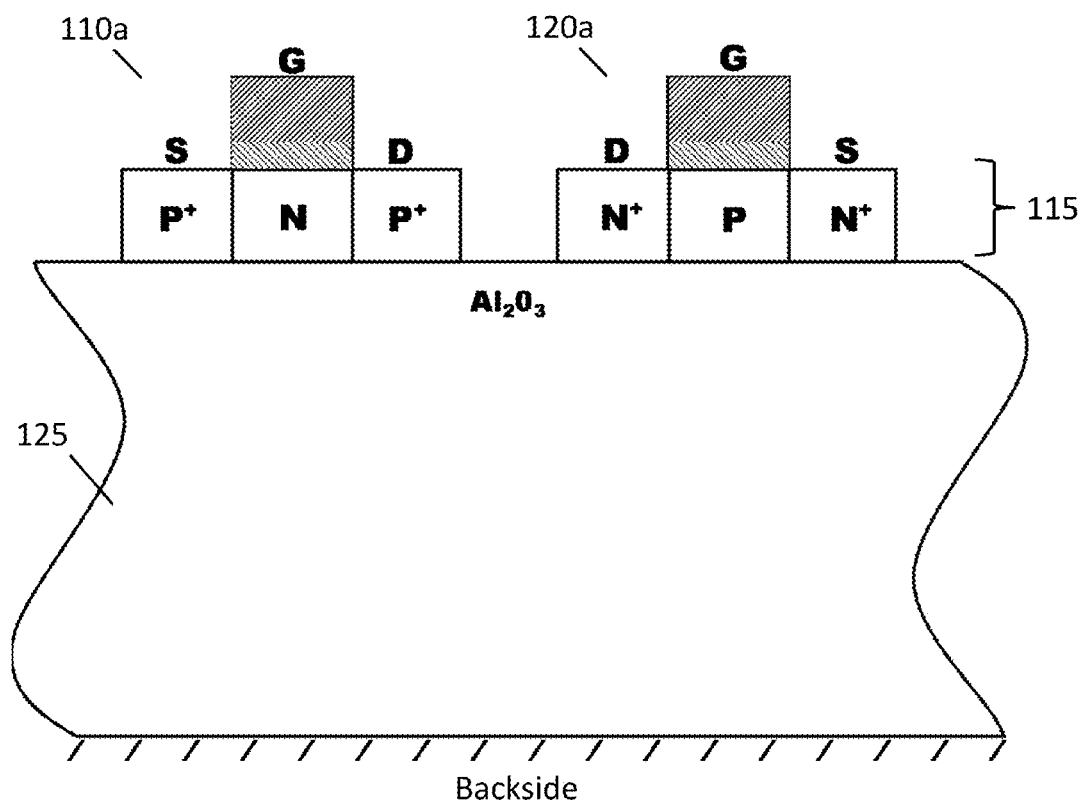
FIGS. 18A-18C show different low voltage transistor structures which can be used in the various embodiments of the HS level shifter according to the present disclosure.
Figure 18B:
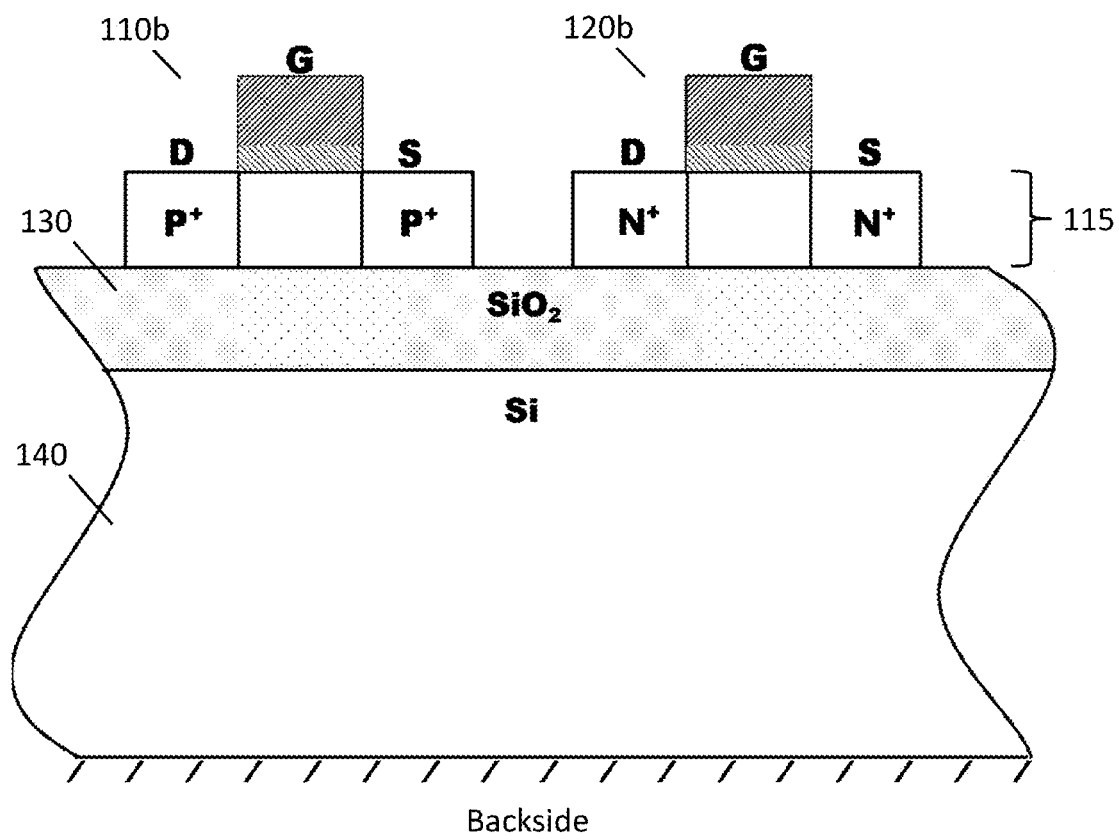
Figure 18C:
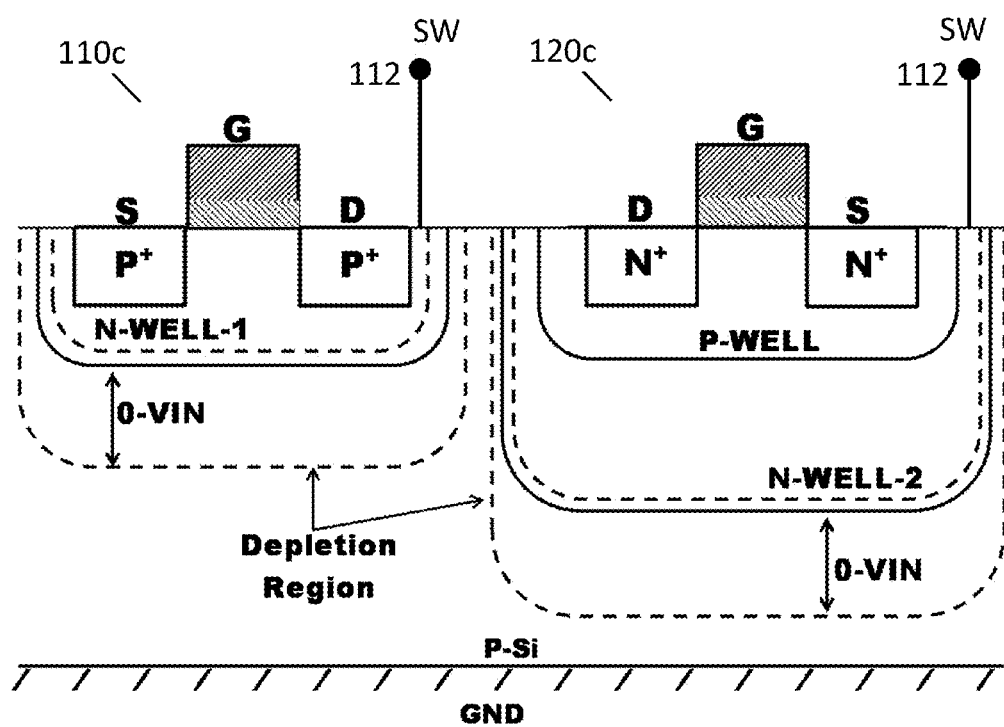

FIGS. 18A, 18B and 18C depict cross sections of the three main CMOS semiconductor technologies, listed above, specifically, SOS, SOI and bulk Si, respectively. A person skilled in the art readily recognizes that each of such cross sections shows a single P and a single N type transistor, and that only the very basic features of the transistors are shown, e.g. their source, S; their drain, D; and their gate, G.

The cross section depictions in FIGS. 18A, 18B and 18C of the two transistor types can be understood by a person skilled in the art to represent any array of transistor circuitry. In each version of CMOS shown, the transistors, both P and N types, are low voltage transistors as used in the level shifter (e.g. HS level shifter (325, 925)) of the present disclosure, e.g., they are capable of handling a low source-drain voltages of only, for example, 5 Volts, or less.

FIG. 18A shows an exemplary silicon on sapphire (SOS) structure comprising two low voltage transistor devices (110a, P type) and (120a, N type) each comprising a gate terminal (G), a drain terminal (D) and a source terminal (S), whose P+ and N+ drain and source regions are formed within a thin Si layer (115) fabricated atop a sapphire ($Al_2O_3$) substrate (125). While the low voltage transistors (110a) and (110b) in FIG. 10A can only withstand low voltage, say up to 5V (between any two S, D, G terminals), an entire transistor circuit of the SOS structure depicted in FIG. 18A can float from 0-$V_{IN}$ volts with respect to GND. According to an embodiment of the present disclosure, the backside of the SOS structure depicted in FIG. 18A, denoted Backside, can be connected to a DC voltage, such as 0V (GND), or left unconnected (floating). In the case of the level shifter (e.g. HS level shifter (325, 925)) according to the present teachings, the reference voltage for the level shifter circuitry (e.g. high side) is at $V_{SS}$ level (e.g. tied at common node SW), which is either 0 V (e.g. when the LS GaN FET T1 is ON), up to a voltage level of $V_{IN}$ (e.g. when the HS GaN FET T2 is ON). Therefore, as a person skilled in the art can recognize, the low voltage transistors (110a) and (110b) represented in FIG. 18A can operate at a high voltage (e.g. equal to or larger than Vin) with respect to GND without ever having to handle any high voltage being impressed across them (e.g. across a corresponding source and drain). Instead, the sapphire substrate has the high voltage drop across its entire thickness. In a typical embodiment, the sapphire substrate (125) may be 10's to 100's of micrometers thick and therefore the electric field created by such high voltage is well below the well-known dielectric strength of the sapphire.

FIG. 18B shows an exemplary silicon on insulator (SOI) transistor structure comprising two low voltage transistor devices (110b, P type) and (120b, N type), each comprising a gate terminal (G), a drain terminal (D) and a source terminal (S), in which a thin Si layer (115), which comprises the P+ and N+ source and drain regions of the P type and N type transistors, is formed on a buried silicon dioxide layer (130), thence on a Si substrate (140). As in the case of the SOS structure of FIG. 18A, while the low voltage transistors (110b) and (120b) of the structure depicted in FIG. 10B can only withstand up to, say, 5V (between any two S, D, G terminals), the entire transistor structure can float from 0-$V_{IN}$ volts with respect to GND. According to an embodiment of the present disclosure, the backside of the SOI structure depicted in FIG. 18B, denoted Backside, can be connected to a DC voltage, such as 0V (GND), or left unconnected (floating). In the case of the level shifter (e.g. HS level shifter (325, 925)) according to the present teachings, the reference voltage for the level shifter circuitry (e.g. high side) is at $V_{SS}$ voltage level, which is either 0 V (e.g. when the LS GaN FET T1 is ON) up to a voltage level of VIN (e.g. when the HS GaN FET T2 is ON). Therefore, as a person skilled in the art can recognize, the low voltage transistors (110b) and (120b) represented in FIG. 18B can operate at a high voltage (e.g. equal to or larger than Vin) with respect to GND without ever having that high voltage impressed across them (i.e. across any two constituent terminals S, D, G). Instead, the buried silicon dioxide layer has the high voltage drop across its thickness. Such buried silicon dioxide layer is clearly much thinner than the sapphire substrate in the SOS embodiment shown in FIG. 18A.

In a typical SOI embodiment, the Si layer (115) and the buried silicon dioxide layer (130) can typically be 0.1-1.0 micrometers in thickness and the Si substrate (140) underneath the Si layer (115) and the buried silicon dioxide layer (130) can typically be 10's to 100's of micrometers thick. Therefore, the electric field inside the buried silicon dioxide layer (130) can typically be higher than in the sapphire substrate case depicted in FIG. 18A (since typically the sapphire substrate is much thicker than the silicon dioxide layer and can therefore withstand a much higher $V_{IN}$ voltage). In a properly designed embodiment, the buried silicon dioxide layer (130) is thick enough to withstand a maximum electric field associated to a voltage $V_{IN}$ plus any noise spikes that may be impressed on the $V_{IN}$ voltage, applied to the GND plane of the Si substrate (140).

FIG. 18C shows an exemplary bulk Si transistor structure comprising two low voltage transistor devices (110c, P type) and (120c, N type), each comprising a gate terminal (G), a drain terminal (D) and a source terminal (S). A person skilled in the art readily knows that such structure is at least semiconductive throughout its entire thickness. Since Si is a good conductor relative to insulators such as silicon dioxide or sapphire, the high voltage $V_{IN}$ must be dropped across corresponding reverse-biased diodes of such bulk Si structure that have high enough stand-off voltage to provide isolation to the grounded Si substrate. In the exemplary structure depicted in FIG. 18C, the high voltage, $V_{IN}$, is dropped across the diode formed by the bottom N-wells (N-WELL-1 and N-WELL-2) and the p-type substrate. This is shown in FIG. 18C for the typical case where $V_{IN}$ is positive, where N-WELL1 and N-WELL2 are connected, via an associated terminal (112), to node SW which swings form 0 (GND) to $V_{IN}$. The person skilled in the art readily knows that for the case where $V_{IN}$ is negative, polarities of the structures shown in FIG. 18C can be reversed (e.g. all P structures to N structures and vice versa) in order to allow the bulk p-Si substrate, which is grounded on its back side (e.g. connected to GND), to handle a large negative voltage drop ($V_{IN}$<0V). In such case where $V_{IN}$ is negative, node SW can be connected to P-WELLS provided within the Si substrate (connection not shown in FIG. 18C). The person skilled in the art readily knows that other well structures can be used in a Si structure as long as such wells can provide high voltage handling capability equal to or larger than $V_{IN}$. Again, while the low voltage transistors in the structure depicted in FIG. 18C can only withstand up to, for example, 5V, the N-wells can float from 0-$V_{IN}$ volts with respect to GND.

Unlike insulators such as silicon dioxide or sapphire, diodes in bulk Si structures can block current only in one direction, therefore as described above, the exemplary transistor structure depicted in FIG. 18C used in a level shifter (e.g. HS level shifter (325, 960)) according to the various embodiments of the present disclosure can work for cases where $V_{IN}$>0V (=GND), or, by using an alternate wells structure (e.g. reverse polarity structures), for cases where $V_{IN}$<0V. The insulator-based transistor structures depicted in FIGS. 18A and 18B can handle both positive and negative values of $V_{IN}$, and can therefore be used in a level shifter according to the various embodiments of the present disclosure where $V_{IN}$ takes either or both positive and negative values. Since bulk Si structures can be cheaper, however, it is valuable to note that while the insulator-based solutions may have superior performance or flexibility, the bulk Si solution may have reduced cost.

With this semiconductor description, an innovative apparatus for biasing and driving high voltage semiconductor devices using only low (breakdown) voltage transistors has been disclosed.

Applications that may include the novel apparatus and systems of various embodiments include electronic circuitry used in high-speed computers, communication and signal processing circuitry, modems, single or multi-processor modules, single or multiple embedded processors, data switches, and application-specific modules, including multilayer, multi-chip modules. Such apparatus and systems may further be included as sub-components within a variety of electronic systems, such as televisions, cellular telephones, personal computers (e.g., laptop computers, desktop computers, handheld computers, tablet computers, etc.), workstations, radios, video players, audio players (e.g., mp3 players), vehicles, medical devices (e.g., heart monitor, blood pressure monitor, etc.) and others. Some embodiments may include a number of methods.

It may be possible to execute the activities described herein in an order other than the order described. Various activities described with respect to the methods identified herein can be executed in repetitive, serial, or parallel fashion.

The accompanying drawings that form a part hereof show, by way of illustration and not of limitation, specific embodiments in which the subject matter may be practiced. The embodiments illustrated are described in sufficient detail to enable those skilled in the art to practice the teachings disclosed herein. Other embodiments may be utilized and derived there-from, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

Such embodiments of the inventive subject matter may be referred to herein individually or collectively by the term "invention" merely for convenience and without intending to voluntarily limit the scope of this application to any single invention or inventive concept, if more than one is in fact disclosed. Thus, although specific embodiments have been illustrated and described herein, any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent to those of skill in the art upon reviewing the above description.

The Abstract of the Disclosure is provided to comply with 37 C.F.R. § 1.72(b), requiring an abstract that will allow the reader to quickly ascertain the nature of the technical disclosure. It is submitted with the understanding that it will not be used to interpret or limit the scope or meaning of the claims. In the foregoing Detailed Description, various features are grouped together in a single embodiment for the purpose of streamlining the disclosure. This method of disclosure is not to be interpreted to require more features than are expressly recited in each claim. Rather, inventive subject matter may be found in less than all features of a single disclosed embodiment. Thus the following claims are hereby incorporated into the Detailed Description, with each claim standing on its own as a separate embodiment.

The invention claimed is:

1. A circuital arrangement configured to control a high side (HS) device and a low side (LS) device arranged in a stacked configuration, the HS device and the LS device capable of withstanding a voltage higher than or equal to a first voltage, the circuital arrangement comprising:
 a HS control circuit operating between a first switching voltage and a second switching voltage based on the first switching voltage, the first switching voltage being an output voltage at a common output node of the stacked HS device and LS device, the HS control circuit configured to provide a HS output control signal at a voltage higher than the first voltage to the HS device;
 a LS control circuit configured to provide a LS output control signal to the LS device; and
 a dead time control circuit configured, to generate timing information for the HS output control signal and the LS output control signal,
 wherein all transistor devices of the HS control circuit, the LS control circuit and the dead time controller circuit, are each configured to withstand a second voltage substantially smaller than the first voltage.

2. The circuital arrangement of claim 1, wherein the timing information for the HS output control signal is coupled to the transistor devices of the HS control circuit by way of a DC blocking edge detection circuit.

3. The circuital arrangement of claim 2, wherein the DC blocking edge detection circuit comprises capacitive coupling.

4. The circuital arrangement of claim 3, wherein:
 the HS output control signal comprises a first pulse in correspondence of an ON state of the HS device,
 the LS output control signal comprises a second pulse in correspondence of an ON state of the LS device,
 the first pulse and the second pulse are non-overlapping, and
 a pulse width of the first pulse is substantially equal to a pulse width of an input pulse to the dead time control circuit.

5. The circuital arrangement of claim 3, wherein the dead time controller circuits further comprises:
 a HS processing path configured to generate the timing information of the HS output control signal; and
 a LS processing path configured to generate the timing information of the LS output control signal.

6. The circuital arrangement of claim 5, wherein the timing information is based on one or both of a) an adjusted position of a rising edge of an input signal, and b) an adjusted position of a falling edge of the input signal.

7. The circuital arrangement of claim 6, wherein the HS processing path and the LS processing path each comprise two processing circuits.

8. The circuital arrangement of claim 7, wherein each of the processing circuits performs an adjustment of one of a) the rising edge of the input signal, and b) the falling edge of the input signal.

9. The circuital arrangement of the claim 8, wherein each of the processing circuits comprises a transistor, a current source, a capacitor and a comparator.

10. The circuital arrangement of claim 8, wherein each of the processing circuits comprises a transistor, a current source, a capacitor and an inverter.

11. The circuital arrangement of claim 10, wherein the adjustment is based on a time delay, with respect to one of a) the rising edge of the input signal, and b) the falling edge of the input signal, provided by the current source, the capacitor and a trip point voltage of the inverter.

12. The circuital arrangement of claim 11, wherein the current source comprises control circuitry configured to adjust a magnitude of an output current of the current source based on a variation of the trip point voltage of the inverter.

13. The circuital arrangement of claim 12, wherein the variation of the trip point voltage is based on one or more of a) a fabrication process of the inverter, b) a voltage supply to the inverter and c) an operating temperature of the inverter.

14. The circuital arrangement of claim 12 or claim 13, wherein the magnitude of the output current is controlled by a reference resistor.

15. The circuital arrangement of claim 12, wherein the control circuitry comprises:
 an operational amplifier;

a current mirror;
a reference inverter with same characteristics as the inverter of the basic processing circuit, the reference inverter coupled to a first input of the operational amplifier;
a transistor, wherein a gate of the transistor is connected to an output of the operational amplifier, a source of the transistor connected to a second input of the operational amplifier, and a drain of the transistor connected to a reference current leg of the current mirror; and
the reference resistor connected between the source of the transistor and a reference ground.

16. The circuital arrangement of claim 15, wherein the reference inverter comprises two series connected transistors, wherein gates and drains of the series connected transistors are connected to the first input of the operational amplifier.

17. The circuital arrangement of claim 3, wherein the first voltage is equal to or higher than 10 volts, and the second voltage is equal to or lower than 5 volts.

18. The circuital arrangement of claim 3, wherein the first voltage is equal to or higher than 25 volts, and the second voltage is equal to or lower than 2.5 volts.

19. The circuital arrangement of claim 3, wherein the transistor devices comprise one of: a) a silicon on sapphire (SOS) transistor structure, b) a silicon on insulator (SOI) transistor structure, and c) a bulk silicon (Si) transistor structure.

20. The circuital arrangement of claim 19 fabricated on a sapphire substrate of a), wherein the thickness of the sapphire substrate is selected such as to withstand a voltage drop equal to or larger than the first switching voltage.

21. The circuital arrangement of claim 20, wherein a thickness of the sapphire substrate is in a range of 10's to 100's micrometers.

22. The circuital arrangement of claim 19, wherein b) further comprises a buried silicon dioxide layer whose silicon dioxide thickness is capable of withstanding a voltage drop equal to or larger than the first switching voltage.

23. The circuital arrangement of claim 22, wherein the silicon dioxide thickness of the buried silicon dioxide layer is 0.1-1.0 micrometers.

24. A high voltage circuit operating at a voltage higher than 10 V comprising the circuital arrangement of claim 1, wherein the HS device and the LS device are arranged in a stacked configuration and the common node is in correspondence of a source terminal of the HS device and a drain terminal of the LS device.

25. The high voltage circuit of claim 24, wherein:
the LS output control signal and the HS output control signal respectively control the LS device and the HS device to operate in one of two modes of operation; an ON mode which provides a conduction path to the voltage higher than 10 V, and an OFF mode which removes the conduction path, and
a time period in correspondence of the ON mode of the LS device is non-overlapping with a time period in correspondence of the ON mode of the HS device.

26. The high voltage circuit of claim 25, wherein the conduction path is a conduction path between a drain terminal and a source terminal of the LS/HS device.

27. The high voltage circuit of claim 26, wherein control of the LS/HS device is provided via connection of a gate terminal of the LS/HS device to an output terminal of the LS/HS control circuit, respectively.

28. The high voltage circuit of claim 27, wherein during the ON mode of operation of the HS device, the first switching voltage at the common node is substantially equal to the voltage higher than 10 V, and during the OFF mode of operation of the HS device, the first switching voltage at the common node is substantially equal to a reference voltage.

29. The high voltage circuit of claim 28, wherein the voltage higher than 10 V is coupled to a drain terminal of the HS device, and the reference voltage is coupled to a source terminal of the LS device.

30. The high voltage circuit of claim 29, wherein a duty cycle of the first switching voltage is substantially equal to a duty cycle of the HS output control signal.

31. A DC/DC converter for conversion of a high DC voltage to a low DC voltage comprising the high voltage circuit of claim 30.

32. A method for controlling a high side (HS) device and a low side (LS) device arranged in a stacked configuration, the HS device and the LS device capable of withstanding a voltage higher than or equal to a first voltage, the method comprising:
receiving an input timing signal;
based on the receiving, generating control timing signals for controlling the HS device and the LS device;
generating, via capacitive coupling of the control timing signals, an HS output control signal at a voltage higher than the first voltage;
generating, based on the control timing signals, an LS output control signal;
controlling the HS device via the HS output control signal; and
controlling the LS device via the LS output control signal;
wherein the steps of generating are provided by transistor devices configured to withstand a second voltage substantially smaller than the first voltage.

33. The method of claim 32, wherein the capacitive coupling provides DC blocking of the control timing signals.

34. The method of claim 32 or claim 33, wherein the capacitive coupling provides timing information associated to rising edges and falling edges of the control timing signals.

35. The method of claim 32, further comprising:
based on the controlling of the HS device and the controlling of the LS device, providing a positive dead-time between a turn OFF time of the LS device and a turn ON time of the HS device , and providing a positive dead-time between a turn OFF time of the HS device and a turn ON time of the LS device.

36. The method of claim 35, wherein a duty cycle of the HS output control signal is substantially equal to a duty cycle of the input timing signal.

37. The method of claim 32, further comprising:
based on the controlling, generating a DC voltage, smaller than the first voltage, proportional to a ratio of an ON time of the HS device to a total period.

* * * * *